(12) United States Patent
Paulus et al.

(10) Patent No.: US 11,688,407 B2
(45) Date of Patent: *Jun. 27, 2023

(54) DECODER, ENCODER, AND METHOD FOR INFORMED LOUDNESS ESTIMATION IN OBJECT-BASED AUDIO CODING SYSTEMS

(71) Applicant: Fraunhofer-Gesellschaft zur Foerderung der angewandten Forschung e.V., Munich (DE)

(72) Inventors: Jouni Paulus, Nuremberg (DE); Sascha Disch, Fuerth (DE); Harald Fuchs, Roettenbach (DE); Bernhard Grill, Lauf (DE); Oliver Hellmuth, Budenhof (DE); Adrian Murtaza, Craiova (RO); Falko Ridderbusch, Augsburg (DE); Leon Terentiv, Erlangen (DE)

(73) Assignee: Fraunhofer-Gesellschaft zur Förderung der angewandten Forschung e.V.

( * ) Notice: Subject to any disclaimer, the term of this patent is extended or adjusted under 35 U.S.C. 154(b) by 0 days.

This patent is subject to a terminal disclaimer.

(21) Appl. No.: 17/114,735

(22) Filed: Dec. 8, 2020

(65) Prior Publication Data
US 2021/0118454 A1 Apr. 22, 2021

Related U.S. Application Data

(63) Continuation of application No. 16/657,686, filed on Oct. 18, 2019, now Pat. No. 10,891,963, which is a
(Continued)

(30) Foreign Application Priority Data
Nov. 27, 2013 (EP) ..................... 13194664

(51) Int. Cl.
G10L 19/008 (2013.01)
G10L 19/26 (2013.01)
H03G 3/20 (2006.01)

(52) U.S. Cl.
CPC .......... G10L 19/008 (2013.01); G10L 19/265 (2013.01); H03G 3/20 (2013.01)

(58) Field of Classification Search
CPC . G10L 19/008; H04S 2400/03; H04S 2420/03
(Continued)

(56) References Cited

U.S. PATENT DOCUMENTS 7,054,820 B2   5/2006   Potekhin et al.
7,415,120 B1   8/2008   Vaudrey et al.
(Continued)

FOREIGN PATENT DOCUMENTS

CA   2167966 A1   8/1996
CN   1068689 A    2/1993
(Continued)

OTHER PUBLICATIONS

Office Action dated Oct. 4, 2021 issued in related U.S. Appl. No. 16/883,852 (44 pages).
(Continued)

*Primary Examiner* — Alexander Krzystan
(74) *Attorney, Agent, or Firm* — Haynes and Boone LLP

(57) ABSTRACT

A decoder for generating an audio output signal having one or more audio output channels includes a receiving interface for receiving an audio input signal including a plurality of audio object signals, for receiving loudness information on the audio object signals, and for receiving rendering information indicating whether one or more of the audio object signals shall be amplified or attenuated. Moreover, the decoder includes a signal processor for generating the one or more audio output channels of the audio output signal. The
(Continued)

signal processor is configured to determine a loudness compensation value depending on the loudness information and depending on the rendering information. Furthermore, the signal processor is configured to generate the one or more audio output channels of the audio output signal from the audio input signal depending on the rendering information and depending on the loudness compensation value. Moreover, an encoder is provided.

20 Claims, 12 Drawing Sheets

Related U.S. Application Data continuation of application No. 15/154,522, filed on May 13, 2016, now Pat. No. 10,497,376, which is a continuation of application No. PCT/EP2014/075787, filed on Nov. 27, 2014.

(58) Field of Classification Search
USPC ............................................. 381/22; 704/500
See application file for complete search history.

(56) References Cited

U.S. PATENT DOCUMENTS

| | | | |
|---|---|---|---|
| 7,825,322 B1 | 11/2010 | Classen et al. | |
| 9,947,325 B2 | 4/2018 | Paulus et al. | |
| 2003/0221562 A1* | 12/2003 | Bloomer | F02M 35/0215 96/384 |
| 2005/0060982 A1* | 3/2005 | Mani | F02C 7/045 181/213 |
| 2006/0236048 A1* | 10/2006 | Deguchi | G06F 11/2069 711/165 |
| 2008/0130904 A1 | 6/2008 | Faller | |
| 2009/0210238 A1 | 8/2009 | Kim et al. | |
| 2009/0326960 A1 | 12/2009 | Breebaat | |
| 2010/0286804 A1 | 11/2010 | Oh et al. | |
| 2010/0324915 A1 | 12/2010 | Seo et al. | |
| 2014/0104033 A1 | 4/2014 | Griffiths et al. | |
| 2015/0325243 A1 | 11/2015 | Grant et al. | |
| 2015/0332680 A1 | 11/2015 | Crockett et al. | |
| 2016/0104496 A1* | 4/2016 | Purnhagen | H04S 3/008 381/23 |
| 2016/0219387 A1 | 7/2016 | Ward et al. | |
| 2017/0180905 A1 | 6/2017 | Purnhagen et al. | |

FOREIGN PATENT DOCUMENTS

| | | |
|---|---|---|
| CN | 101529501 A | 9/2009 |
| CN | 101689368 A | 3/2010 |
| CN | 102714038 A | 10/2012 |
| CN | 203134365 U | 8/2013 |
| DE | 202013001075 U1 | 4/2013 |
| EP | 2146522 A1 | 1/2010 |
| EP | 2442303 A2 | 4/2012 |
| JP | 2009-532739 A | 9/2009 |
| JP | 2010-511908 A | 4/2010 |
| JP | 2010178375 A | 8/2010 |
| JP | 3183637 U | 5/2013 |
| JP | 2014-525048 A | 9/2014 |
| JP | 2016-503635 A | 2/2016 |
| RU | 2430430 C2 | 11/2010 |
| RU | 2406166 C2 | 12/2010 |
| RU | 2455708 C2 | 7/2012 |
| RU | 2485605 C2 | 6/2013 |
| WO | WO 2001/039370 A2 | 5/2001 |
| WO | WO 2008/035275 A2 | 3/2008 |
| WO | WO2008035275 A2 | 3/2008 |
| WO | WO 2008/046531 A1 | 4/2008 |
| WO | WO2008046531 A1 | 4/2008 |
| WO | WO 2008/069593 A | 6/2008 |
| WO | WO 2009/131391 A1 | 10/2009 |
| WO | WO 2010/109918 | 9/2010 |
| WO | WO 2011124608 A1 | 10/2011 |
| WO | WO 2012/125855 A1 | 9/2012 |
| WO | WO 2012/146757 A1 | 11/2012 |

OTHER PUBLICATIONS

Office Action dated Aug. 26, 2019 issued in related U.S. Appl. No. 15/912,010 (19 pages).
Office Action dated Jul. 15, 2019 issued in the parallel Indian patent application No. 2197/MUMNP/2015 (6 pages).
Decision of Patent Grant issued in parallel Japanese Patent App. No. 2016-532000 dated Apr. 24. 2018 (6 pages).
Office Action issued in related U.S. Appl. No. 15/912,010 dated Jun. 22, 2018 (23 pages).
Office Action issued in related U.S. Appl. No. 14/822,678 dated May 11, 2017 (30 pages).
Decision to Grant issued in related Japanese patent application No. 2016-509509 dated Aug. 31, 2017 (6 pages with English translation).
Office Action issued in parallel Russian patent application No. 2016125242 dated Jun. 22, 2017 with English translation (17 pages).
Office Action issued in parallel Korean patent application No. 10-2016-7014090 dated Apr. 13, 2017 with English translation (13 pages).
Robinson Charles Q. et al., "Dynamic Range Control via Metadata," Audio Engineering Society Convention 107, Audio Engineering Society, Sep. 27, 1999 (14 pages).
C. Faller and F. Baumgarte, "Binaural Cue Coding—Part II: Schemes and applications," IEEE Trans. On Speech and Audio Proc., vol. 11, No. 6, Nov. 2003.
EBU Recommendation R 128 "Loudness normalization and permitted maximum level of audio signals," Geneva 2011.
C. Faller, "Parametric Joint-Coding of Audio Sources," 120$^{th}$ AES Convention, Paris 2006.
M. Parvaix and L. Girin: "Informed Source Separation of Underdetermined Instantaneous Stereo Mixtures Using Source Index Embedding," IEEE ICASSP, 2010.
A. Liutkus et al.: "Informed Source Separation Through Spectrogram Coding and Data Embedding," Signal Processing Journal, 2011.
A. Ozerov et al.: "Informed source separation: source coding meets source separation," IEEE Workshop on Applications of Signal Processing to Audio and Acoustics, 2011.
S. Zhang et al.: "An informed Source Separation System for Speech Signals," INTERSPEECH, 2011.
L. Girin et al.: "Informed Audio Source Separation from Compressed Linear Stereo Mixtures," AES 42$^{nd}$ International Conference: Semantic Audio, 2011.
International Telecommunication Union: "Recommendation ITU-R BS. 1770-3—Algorithms to measure audio programming loudness and true-peak audio level," Geneva, 2012.
J. Herre et al.: "From SAC to SAOC—Recent Developments in Parametric Coding of Spatial Audio," 22$^{nd}$ Regional AES Conference, Cambridge, UK, Apr. 2007.
J. Engdegård et al.: "Spatial Audio Object Coding (SAOC)—The Upcoming MPEG Standard on Parametric Object Based Audio Coding," 124$^{th}$ AES Convention, Amsterdam 2008.
ISO/IEC, "MPEG audio technologies—Part 2: Spatial Audio Object Coding (SAOC)," ISO/IEC JTC1/SC29/WG11 (MPEG) International Standard 23002-2.
ISO/IEC, "MPEG audio technologies—Part 2: Spatial Audio Object Coding (SAOC)—Amendment 3, Dialogue Enhancement," ISO/IEC 23003-2:2010/DAM 3 (Mar. 15, 2015), Dialogue Enhancement.
A Guide to Dolby Metadata, Jan. 1, 2005, pp. 1-28, XP055102178, URL:http://www.dolby.com/uploadedFiles/Assets/US/Doc/Professional/18_Metadata.Guide.pdf.
M. Parvaix et al.: "A watermarking-based method for informed source separation of audio signals with a single sensor," IEEE Transactions on Audio, Speech and Language Processing, 2010.

(56) References Cited

OTHER PUBLICATIONS

Office Action issued in parallel Russian patent application No. 2015135181 dated Nov. 11, 2016 (11 pages with English translation).

Regis et al.: "A New Multichannel Sound Production System for Digital Television," Proceedings of the $1^{st}$ Brazil Japan Symposium on Advances in Digital Television, http://www.sbitvd.org.br, 2010 (5 pages).

Office Action dated Jun. 21, 2016 issued in co0pending Korean patent application No. 10-2015-7021813 (17 pages with English translation).

Office Action dated Jun. 22, 2022 issued in the parallel Brazilian patent application No. BR112016011988-6.

Office Action dated Feb. 18, 2022 issued in related India patent application No. 2197/MUMNP/2015 (3 pages).

Office Action dated Dec. 20, 2022 issued in the parallel Chinese patent application No. 202010097492.6 (17 pages with English translation).

\* cited by examiner

DECODER, ENCODER, AND METHOD FOR INFORMED LOUDNESS ESTIMATION IN OBJECT-BASED AUDIO CODING SYSTEMS

CROSS-REFERENCE TO RELATED APPLICATIONS

This application is a continuation of copending U.S. patent application Ser. No. 16/657,686, filed Oct. 18, 2019, which in turn is a continuation of copending U.S. patent application Ser. No. 15/154,522, filed May 13, 2016, which in turn is a continuation of copending International Application No. PCT/EP2014/075787, filed Nov. 27, 2014, which is incorporated herein by reference in its entirety, and additionally claims priority from European Application No. EP 13194664.2, filed Nov. 27, 2013, which is also incorporated herein by reference in its entirety.

BACKGROUND OF THE INVENTION

The present invention relates to audio signal encoding, processing and decoding, and, in particular, to a decoder, an encoder and method for informed loudness estimation in object-based audio coding systems.

Recently, parametric techniques for bitrate-efficient transmission/storage of audio scenes comprising multiple audio object signals have been proposed in the field of audio coding [BCC, JSC, SAOC, SAOC1, SAOC2] and informed source separation [ISS1, ISS2, ISS3, ISS4, ISS5, ISS6]. These techniques aim at reconstructing a desired output audio scene or audio source object based on additional side information describing the transmitted/stored audio scene and/or source objects in the audio scene. This reconstruction takes place in the decoder using an informed source separation scheme. The reconstructed objects may be combined to produce the output audio scene. Depending on the way the objects are combined, the perceptual loudness of the output scene may vary.

In TV and radio broadcast, the volume levels of the audio tracks of various programs may be normalized based on various aspects, such as the peak signal level or the loudness level. Depending on the dynamic properties of the signals, two signals with the same peak level may have a widely differing level of perceived loudness. Now switching between programs or channels the differences in the signal loudness are very annoying and have been to be a major source for end-user complaints in broadcast.

In conventional technology, it has been popet roposed to normalize all the programs on all channels similarly to a common reference level using a measure based on perceptual signal loudness. One such recommendation in Europe is the EBU Recommendation R128 [EBU] (later referred to as R128).

The recommendation says that the "program loudness", e.g., the average loudness over one program (or one commercial, or some other meaningful program entity) should equal a specified level (with small allowed deviations). When more and more broadcasters comply with this recommendation and the normalization that may be used, the differences in the average loudness between programs and channels should be minimized.

Loudness estimation can be performed in several ways. There exist several mathematical models for estimating the perceptual loudness of an audio signal. The EBU recommendation R128 relies on the model presented in ITU-R BS.1770 (later referred to as BS.1770) (see [ITU]) for the loudness estimation.

As stated before, e.g., according to the EBU Recommendation R128, the program loudness, e.g., the average loudness over one program should equal a specified level with small allowed deviations. However, this leads to significant problems when audio rendering is conducted, unsolved until now in conventional technology. Conducting audio rendering on the decoder side has a significant effect on the overall/total loudness of the received audio input signal. However, despite scene rendering is conducted, the total loudness of the received audio signal shall remain the same.

Currently, no specific decoder-side solution exists for this problem.

EP 2 146 522 A1 ([EP]), relates to concepts for generating audio output signals using object based metadata. At least one audio output signal is generated representing a superposition of at least two different audio object signals, but does not provide a solution for this problem.

WO 2008/035275 A2 ([BRE]) describes an audio system comprising an encoder which encodes audio objects in an encoding unit that generates a down-mix audio signal and parametric data representing the plurality of audio objects. The down-mix audio signal and parametric data is transmitted to a decoder which comprises a decoding unit which generates approximate replicas of the audio objects and a rendering unit which generates an output signal from the audio objects. The decoder furthermore contains a processor for generating encoding modification data which is sent to the encoder. The encoder then modifies the encoding of the audio objects, and in particular modifies the parametric data, in response to the encoding modification data. The approach allows manipulation of the audio objects to be controlled by the decoder but performed fully or partly by the encoder. Thus, the manipulation may be performed on the actual independent audio objects rather than on approximate replicas thereby providing improved performance.

EP 2 146 522 A1 ([SCH]) discloses an apparatus for generating at least one audio output signal representing a superposition of at least two different audio objects comprises a processor for processing an audio input signal to provide an object representation of the audio input signal, where this object representation can be generated by a parametrically guided approximation of original objects using an object downmix signal. An object manipulator individually manipulates objects using audio object based metadata referring to the individual audio objects to obtain manipulated audio objects. The manipulated audio objects are mixed using an object mixer for finally obtaining an audio output signal having one or several channel signals depending on a specific rendering setup.

WO 2008/046531 A1 ([ENG]) describes an audio object coder for generating an encoded object signal using a plurality of audio objects includes a downmix information generator for generating downmix information indicating a distribution of the plurality of audio objects into at least two downmix channels, an audio object parameter generator for generating object parameters for the audio objects, and an output interface for generating the imported audio output signal using the downmix information and the object parameters. An audio synthesizer uses the downmix information for generating output data usable for creating a plurality of output channels of the predefined audio output configuration.

It would be desirable to have an accurate estimate of the output average loudness or the change in the average loudness without a delay and when the program does not change or the rendering scene is not changed, the average loudness estimate should also remain static.

SUMMARY

According to an embodiment, a decoder for generating an audio output signal including one or more audio output channels may have: a receiving interface for receiving an audio input signal including a plurality of audio object signals, for receiving loudness information on the audio object signals, and for receiving rendering information indicating whether one or more of the audio object signals shall be amplified or attenuated, and a signal processor for generating the one or more audio output channels of the audio output signal, wherein the signal processor is configured to determine a loudness compensation value depending on the loudness information and depending on the rendering information, and wherein the signal processor is configured to generate the one or more audio output channels of the audio output signal from the audio input signal depending on the rendering information and depending on the loudness compensation value.

According to another embodiment, an encoder may have: an object-based encoding unit for encoding a plurality of audio object signals to acquire an encoded audio signal including the plurality of audio object signals, and an object loudness encoding unit for encoding loudness information on the audio object signals, wherein the loudness information includes one or more loudness values, wherein each of the one or more loudness values depends on one or more of the audio object signals.

According to yet another embodiment, a system may have: an inventive encoder for encoding a plurality of audio object signals to acquire an encoded audio signal including the plurality of audio object signals, and an inventive decoder, for generating an audio output signal including one or more audio output channels, wherein the decoder is configured to receive the encoded audio signal as an audio input signal and to receive the loudness information wherein the decoder is configured to further receive rendering information, wherein the decoder is configured to determine a loudness compensation value depending on the loudness information and depending on the rendering information, and wherein the decoder is configured to generate the one or more audio output channels of the audio output signal from the audio input signal depending on the rendering information and depending on the loudness compensation value.

According to yet another embodiment, a method for generating an audio output signal including one or more audio output channels may have the steps of: receiving an audio input signal including a plurality of audio object signals, receiving loudness information on the audio object signals, receiving rendering information indicating whether one or more of the audio object signals shall be amplified or attenuated, determining a loudness compensation value depending on the loudness information and depending on the rendering information, and generating the one or more audio output channels of the audio output signal from the audio input signal depending on the rendering information and depending on the loudness compensation value.

According to yet another embodiment, a method for encoding may have the steps of: encoding an audio input signal including a plurality of audio object signals, and encoding loudness information on the audio object signals, wherein the loudness information includes one or more loudness values, wherein each of the one or more loudness values depends on one or more of the audio object signals.

According to still another embodiment, a non-transitory digital storage medium may have a computer program stored thereon to perform the inventive methods, when said computer program is run by a computer.

An informed way for estimating the loudness of the output in an object-based audio coding system is provided. The provided concepts rely on information on the loudness of the objects in the audio mixture to be provided to the decoder. The decoder uses this information along with the rendering information for estimating the loudness of the output signal. This allows then, for example, to estimate the loudness difference between the default downmix and the rendered output. It is then possible to compensate for the difference to obtain approximately constant loudness in the output regardless of the rendering information. The loudness estimation in the decoder takes place in a fully parametric manner, and it is computationally very light and accurate in comparison to signal-based loudness estimation concepts.

Concepts for obtaining information on the loudness of the specific output scene using purely parametric concepts are provided, which then allows for loudness processing without explicit signal-based loudness estimation in the decoder. Moreover, the specific technology of Spatial Audio Object Coding (SAOC) standardized by MPEG [SAOC] is described, but the provided concepts can be used in conjunction with other audio object coding technologies, too.

A decoder for generating an audio output signal comprising one or more audio output channels is provided. The decoder comprises a receiving interface for receiving an audio input signal comprising a plurality of audio object signals, for receiving loudness information on the audio object signals, and for receiving rendering information indicating whether one or more of the audio object signals shall be amplified or attenuated.

Moreover, the decoder comprises a signal processor for generating the one or more audio output channels of the audio output signal. The signal processor is configured to determine a loudness compensation value depending on the loudness information and depending on the rendering information. Furthermore, the signal processor is configured to generate the one or more audio output channels of the audio output signal from the audio input signal depending on the rendering information and depending on the loudness compensation value.

According to an embodiment, the signal processor may be configured to generate the one or more audio output channels of the audio output signal from the audio input signal depending on the rendering information and depending on the loudness compensation value, such that a loudness of the audio output signal is equal to a loudness of the audio input signal, or such that the loudness of the audio output signal is closer to the loudness of the audio input signal than a loudness of a modified audio signal that would result from modifying the audio input signal by amplifying or attenuating the audio object signals of the audio input signal according to the rendering information.

According to another embodiment, each of the audio object signals of the audio input signal may be assigned to exactly one group of two or more groups, wherein each of the two or more groups may comprise one or more of the audio object signals of the audio input signal. In such an embodiment, the receiving interface may be configured to receive a loudness value for each group of the two or more groups as the loudness information, wherein said loudness value indicates an original total loudness of the one or more audio object signals of said group. Furthermore, the receiving interface may be configured to receive the rendering information indicating for at least one group of the two or more groups whether the one or more audio object signals of said group shall be amplified or attenuated by indicating a modified total loudness of the one or more audio object signals of said group. Moreover, in such an embodiment, the signal processor may be configured to determine the loudness compensation value depending on the modified total loudness of each of said at least one group of the two or more groups and depending on the original total loudness of each of the two or more groups. Furthermore, the signal processor may be configured to generate the one or more audio output channels of the audio output signal from the audio input signal depending on the modified total loudness of each of said at least one group of the two or more groups and depending on the loudness compensation value.

In particular embodiments, at least one group of the two or more groups may comprise two or more of the audio object signals.

Moreover an encoder is provided. The encoder comprises an object-based encoding unit for encoding a plurality of audio object signals to obtain an encoded audio signal comprising the plurality of audio object signals. Furthermore, the encoder comprises an object loudness encoding unit for encoding loudness information on the audio object signals. The loudness information comprises one or more loudness values, wherein each of the one or more loudness values depends on one or more of the audio object signals.

According to an embodiment, each of the audio object signals of the encoded audio signal may be assigned to exactly one group of two or more groups, wherein each of the two or more groups comprises one or more of the audio object signals of the encoded audio signal. The object loudness encoding unit may be configured to determine the one or more loudness values of the loudness information by determining a loudness value for each group of the two or more groups, wherein said loudness value of said group indicates an original total loudness of the one or more audio object signals of said group.

Furthermore, a system is provided. The system comprises an encoder according to one of the above-described embodiments for encoding a plurality of audio object signals to obtain an encoded audio signal comprising the plurality of audio object signals, and for encoding loudness information on the audio object signals. Moreover, the system comprises a decoder according to one of the above-described embodiments for generating an audio output signal comprising one or more audio output channels. The decoder is configured to receive the encoded audio signal as an audio input signal and the loudness information. Moreover, the decoder is configured to further receive rendering information. Furthermore, the decoder is configured to determine a loudness compensation value depending on the loudness information and depending on the rendering information. Moreover, the decoder is configured to generate the one or more audio output channels of the audio output signal from the audio input signal depending on the rendering information and depending on the loudness compensation value.

Moreover, a method for generating an audio output signal comprising one or more audio output channels is provided. The method comprises:

Receiving an audio input signal comprising a plurality of audio object signals.

Receiving loudness information on the audio object signals.

Receiving rendering information indicating whether one or more of the audio object signals shall be amplified or attenuated.

Determining a loudness compensation value depending on the loudness information and depending on the rendering information. And:

Generating the one or more audio output channels of the audio output signal from the audio input signal depending on the rendering information and depending on the loudness compensation value.

Furthermore, a method for encoding is provided. The method comprises:

Encoding an audio input signal comprising a plurality of audio object signals. And:

Encoding loudness information on the audio object signals, wherein the loudness information comprises one or more loudness values, wherein each of the one or more loudness values depends on one or more of the audio object signals.

Moreover, a computer program for implementing the above-described method when being executed on a computer or signal processor is provided.

BRIEF DESCRIPTION OF THE DRAWINGS

Embodiments of the present invention will be detailed subsequently referring to the appended drawings, in which.

DETAILED DESCRIPTION OF THE INVENTION

Before embodiments are described in detail, loudness estimation, Spatial Audio Object Coding (SAOC) and Dialogue Enhancement (DE) are described.

At first, loudness estimation is described.

As already stated before, the EBU recommendation R128 relies on the model presented in ITU-R BS.1770 for the loudness estimation. This measure will be used as an example, but the described concepts below can be applied also for other loudness measures.

The operation of the loudness estimation according to BS.1770 is relatively simple and it is based on the following main steps [ITU]:

The input signal $x_i$ (or signals in the case of multi-channel signal) is filtered with a K-filter (a combination of a shelving and a high-pass filters) to obtain the signal(s) $y_i$.

The mean squared energy $z_i$ of the signal $y_i$ is calculated.

In the case of multi-channel signal, channel weighting $G_i$ is applied, and the weighted signals are summed. The loudness of the signal is then defined to be $$L = c + 10\log_{10}\sum_i G_i z_i,$$

with the constant value c=−0.691. The output is then expressed in the units of "LKFS" (Loudness, K-weighted, relative to Full Scale) which scales similarly to the decibel scale.

In the above formula, $G_i$ may, for example, be equal to 1 for some of the channels, while $G_i$ may, for example, be 1.41 for some other channels. For example, if a left channel, a right channel, a center channel, a left surround channel and a right surround channel is considered, the respective weights $G_i$ may, for example, be 1 for the left, right and center channel, and may, for example, be 1.41 for the left surround channel and the right surround channel, see [ITU].

It can be seen, that the loudness value L is closely related to the logarithm of the signal energy.

In the following, Spatial Audio Object Coding is described.

Object-based audio coding concepts allow for much flexibility in the decoder side of the chain. An example of an object-based audio coding concept is Spatial Audio Object Coding (SAOC).

Figure 4:
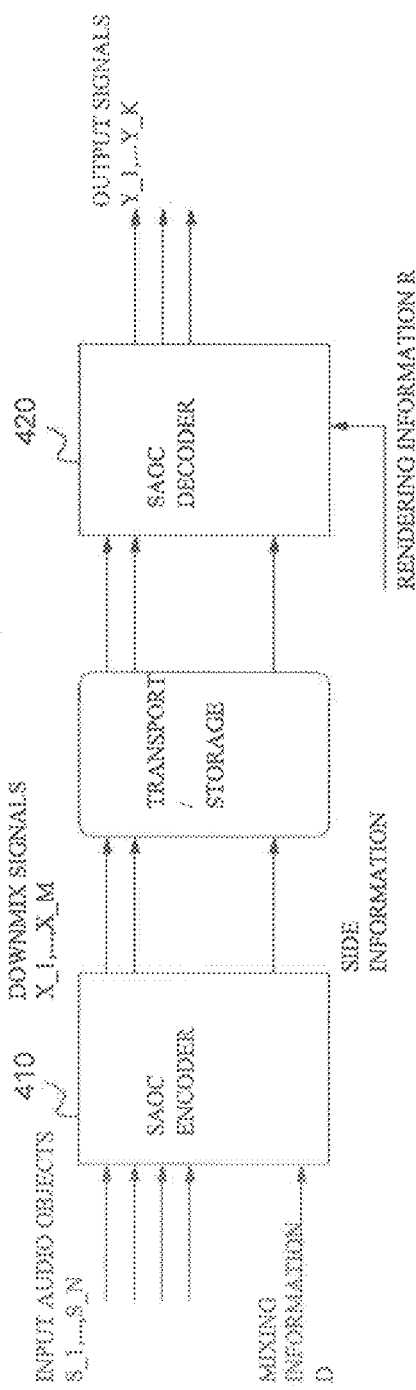
FIG. 4 illustrates a Spatial Audio Object Coding system comprising an SAOC encoder and a SAOC decoder.

FIG. 4 illustrates a Spatial Audio Object Coding (SAOC) system comprising an SAOC encoder 410 and an SAOC decoder 420.

The SAOC encoder 410 receives N audio object signals $S_1, \ldots, S_N$ as the input. Moreover, the SAOC encoder 410 further receives instructions "Mixing information D" how these objects should be combined to obtain a downmix signal comprising M downmix channels $X_1, \ldots, X_M$. The SAOC encoder 410 extracts some side information from the objects and from the downmixing process, and this side information is transmitted and/or stored along with the downmix signals.

A major property of an SAOC system is that the downmix signal X comprising the downmix channels $X_1, \ldots, X_M$ forms a semantically meaningful signal. In other words, it is possible to listen to the downmix signal. If, for example, the receiver does not have the SAOC decoder functionality, the receiver can nonetheless provide the downmix signal as the output.

Figure 5:
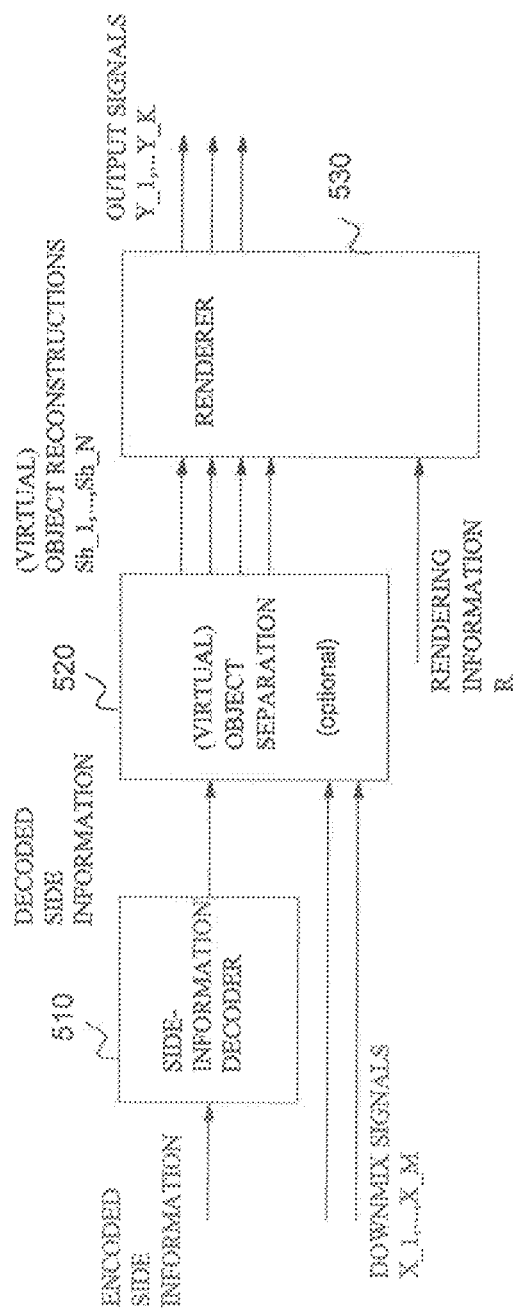
FIG. 5 illustrates an SAOC decoder comprising a side information decoder, an object separator and a renderer.

FIG. 5 illustrates an SAOC decoder comprising a side information decoder 510, an object separator 520 and a renderer 530. The SAOC decoder illustrated by FIG. 5 receives, e.g., from an SAOC encoder, the downmix signal and the side information. The downmix signal can be considered as an audio input signal comprising the audio object signals, as the audio object signals are mixed within the downmix signal (the audio object signals are mixed within the one or more downmix channels of the downmix signal).

The SAOC decoder may, e.g., then attempt to (virtually) reconstruct the original objects, e.g., by employing the object separator 520, e.g., using the decoded side information. These (virtual) object reconstructions $\hat{S}_1, \ldots, \hat{S}_N$, e.g., the reconstructed audio object signals, are then combined based on the rendering information, e.g., a rendering matrix R, to produce K audio output channels $Y_1, \ldots, Y_K$ of an audio output signal Y.

In SAOC, often, audio object signals are, for example, reconstructed, e.g., by employing covariance information, e.g., a signal covariance matrix E, that is transmitted from the SAOC encoder to the SAOC decoder.

For example, the following formula may be employed to reconstruct the audio object signals on the decoder side:

$$\hat{S}=GX \text{ with } G\approx ED^H(DED^H)^{-1}$$

wherein

N number of audio object signals, $N_{samples}$ number of considered samples of an audio object signal M number of downmix channels, X downmix audio signal, size $M \times N_{samples}$, D downmixing matrix, size $M \times N$ E signal covariance matrix, size $N \times N$ defined as $E=X\ X^H$ $\hat{S}$ parametrically reconstructed N audio object signals, size $N \times N_{Samples}$ $(\cdot)^H$ self-adjoint (Hermitian) operator which represents the conjugate transpose of $(\cdot)$ Then, a rendering matrix R may be applied on the reconstructed audio object signals $\hat{S}$ to obtain the audio output channels of the audio output signal Y, e.g., according to the formula:

$$Y=R\hat{S}$$

wherein

K number of the audio output channels $Y_1, \ldots, Y_K$ of the audio output signal Y.

R rendering matrix of size $K \times N$

Y audio output signal comprising the K audio output channels, size $K \times N_{samples}$ In FIG. 5, the process of object reconstruction, e.g., conducted by the object separator 520, is referred to with the notion "virtual", or "optional", as it may not necessarily need to take place, but the desired functionality can be obtained by combining the reconstruction and the rendering steps in the parametric domain (i.e., combining the equations).

In other words, instead of reconstructing the audio object signals using the mixing information D and the covariance information E first, and then applying the rendering information R on the reconstructed audio object signals to obtain the audio output channels $Y_1, \ldots, Y_K$, both steps may be conducted in a single step, so that the audio output channels $Y_1, \ldots, Y_K$ are directly generated from the downmix channels.

For example, the following formula may be employed:

$$Y=RGX \text{ with } G\approx ED^H(DED^H)^{-1}.$$

In principle, the rendering information R may request any combination of the original audio object signals. In practice, however, the object reconstructions may comprise reconstruction errors and the requested output scene may not necessarily be reached. As a rough general rule covering many practical cases, the more the requested output scene differs from the downmix signal, the more there will be audible reconstruction errors.

In the following, dialogue enhancement (DE) is described. The SAOC technology may for example by employed to realize the scenario. It should be noted, that even though the name "Dialogue enhancement" suggests focusing on dialogue-oriented signals, the same principle can be used with other signal types, too.

In the DE-scenario, the degrees of freedom in the system are limited from the general case.

For example, the audio object signals $S_1, \ldots, S_N=S$ are grouped (and possibly mixed) into two meta-objects of a foreground object (FGO) $S_{FGO}$ and a background object (BGO) $S_{BGO}$.

Moreover, the output scene $Y_1, \ldots, Y_K=Y$ resembles the downmix signal $X_1, \ldots, X_M=X$. More specifically, both signals have the same dimensionalities, i.e., K=M, and the end-user can only control the relative mixing levels of the two meta-objects FGO and BGO. To be more exact, the downmix signal is obtained by mixing the FGO and BGO with some scalar weights $$X = h_{FGO} S_{FGO} + h_{BGO} S_{BGO},$$

and the output scene is obtained similarly with some scalar weighting of the FGO and BGO:

$$Y = g_{FGO} S_{FGO} + g_{BGO} S_{BGO}.$$

Depending on the relative values of the mixing weights, the balance between the FGO and BGO may change. For example, with the setting $$\begin{cases} g_{FGO} > h_{FGO} \\ g_{BGO} = h_{BGO} \end{cases}$$

it is possible to increase the relative level of the FGO in the mixture. If the FGO is the dialogue, this setting provides dialogue enhancement functionality.

As a use-case example, the BGO can be the stadium noises and other background sound during a sports event and the FGO is the voice of the commentator. The DE-functionality allows the end-user to amplify or attenuate the level of the commentator in relation to the background.

Embodiments are based on the finding that utilizing the SAOC-technology (or similar) in a broadcast scenario allows providing the end-user extended signal manipulation functionality. More functionality than only changing the channel and adjusting the playback volume is provided.

One possibility to employ the DE-technology is briefly described above. If the broadcast signal, being the downmix signal for SAOC, is normalized in level, e.g., according to R128, the different programs have similar average loudness when no (SAOC-)processing is applied (or the rendering description is the same as the downmixing description). However, when some (SAOC-)processing is applied, the output signal differs from the default downmix signal and the loudness of the output signal may be different from the loudness of the default downmix signal. From the point of view of the end-user, this may lead into a situation in which the output signal loudness between channels or programs may again have the un-desirable jumps or differences. In other words, the benefits of the normalization applied by the broadcaster are partially lost.

This problem is not specific for SAOC or for the DE-scenario only, but may occur also with other audio coding concepts that allow the end-user to interact with the content. However, in many cases it does not cause any harm if the output signal has a different loudness than the default downmix.

As stated before, a total loudness of an audio input signal program should equal a specified level with small allowed deviations. However, as already outlined, this leads to significant problems when audio rendering is conducted, as rendering may have a significant effect on the overall/total loudness of the received audio input signal. However, despite scene rendering is conducted, the total loudness of the received audio signal shall remain the same.

One approach would be to estimate the loudness of a signal while it is being played, and with an appropriate temporal integration concept, the estimate may converge to the true average loudness after some time. The time taken for the convergence is however problematic from the point of view of the end-user. When the loudness estimate changes even when no changes are applied on the signal, the loudness change compensation should also react and change its behavior. This would lead into an output signal with temporally varying average loudness, which can be perceived as rather annoying.

Figure 6:
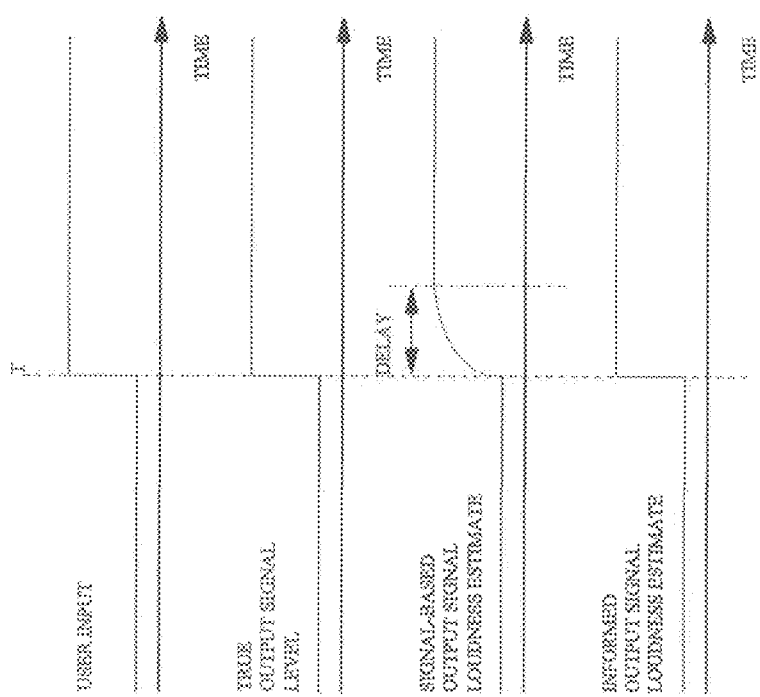
FIG. 6 illustrates a behavior of output signal loudness estimates on a loudness change.

FIG. 6 illustrates a behavior of output signal loudness estimates on a loudness change. Inter alia, a signal-based output signal loudness estimate is depicted, which illustrates the effect of a solution as just described. The estimate approaches the correct estimate quite slowly. Instead of a signal-based output signal loudness estimate, an informed output signal loudness estimate, that immediately determines the output signal loudness correctly would be advantageous.

In particular, in FIG. 6, the user input, e.g., the level of the dialogue object, changes at time instant T by increasing in value. The true output signal level, and correspondingly the loudness, changes at the same time instant. When the output signal loudness estimation is performed from the output signal with some temporal integration time, the estimate will change gradually and reach the correct value after a certain delay. During this delay, the estimate values are changing and cannot reliably be used for further processing the output signal, e.g., for loudness level correction.

As already stated, it would be desirable to have an accurate estimate of the output average loudness or the change in the average loudness without a delay and when the program does not change or the rendering scene is not changed, the average loudness estimate should also remain static. In other words, when some loudness change compensation is applied, the compensation parameter should change only when either the program changes or there is some user interaction.

The desired behavior is illustrated in the lowest illustration of FIG. 6 (informed output signal loudness estimate). The estimate of the output signal loudness shall change immediately when the user input changes.

Figure 2:
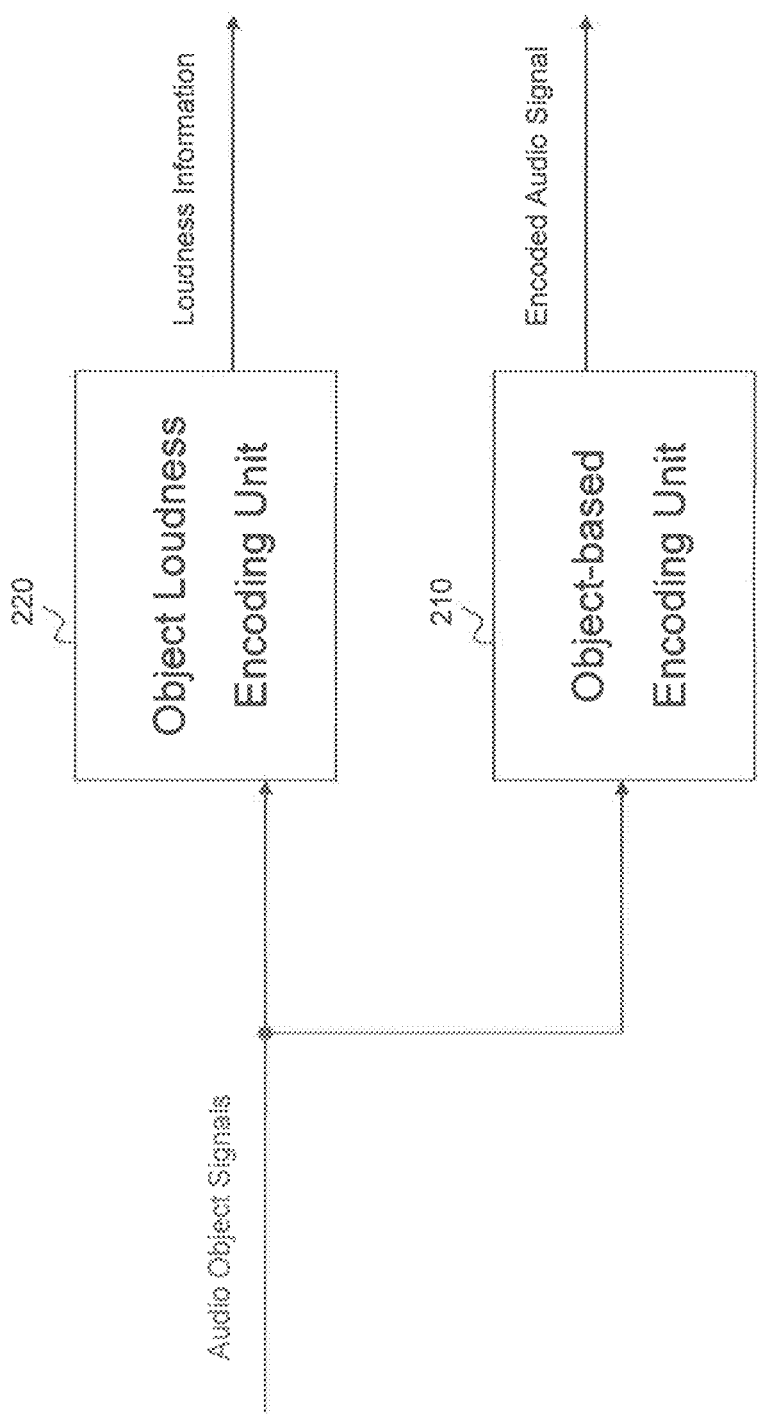
FIG. 2 illustrates an encoder according to an embodiment.

FIG. 2 illustrates an encoder according to an embodiment.

The encoder comprises an object-based encoding unit 210 for encoding a plurality of audio object signals to obtain an encoded audio signal comprising the plurality of audio object signals.

Furthermore, the encoder comprises an object loudness encoding unit 220 for encoding loudness information on the audio object signals. The loudness information comprises one or more loudness values, wherein each of the one or more loudness values depends on one or more of the audio object signals.

According to an embodiment, each of the audio object signals of the encoded audio signal is assigned to exactly one group of two or more groups, wherein each of the two or more groups comprises one or more of the audio object signals of the encoded audio signal. The object loudness encoding unit 220 is configured to determine the one or more loudness values of the loudness information by determining a loudness value for each group of the two or more groups, wherein said loudness value of said group indicates an original total loudness of the one or more audio object signals of said group.

Figure 1:
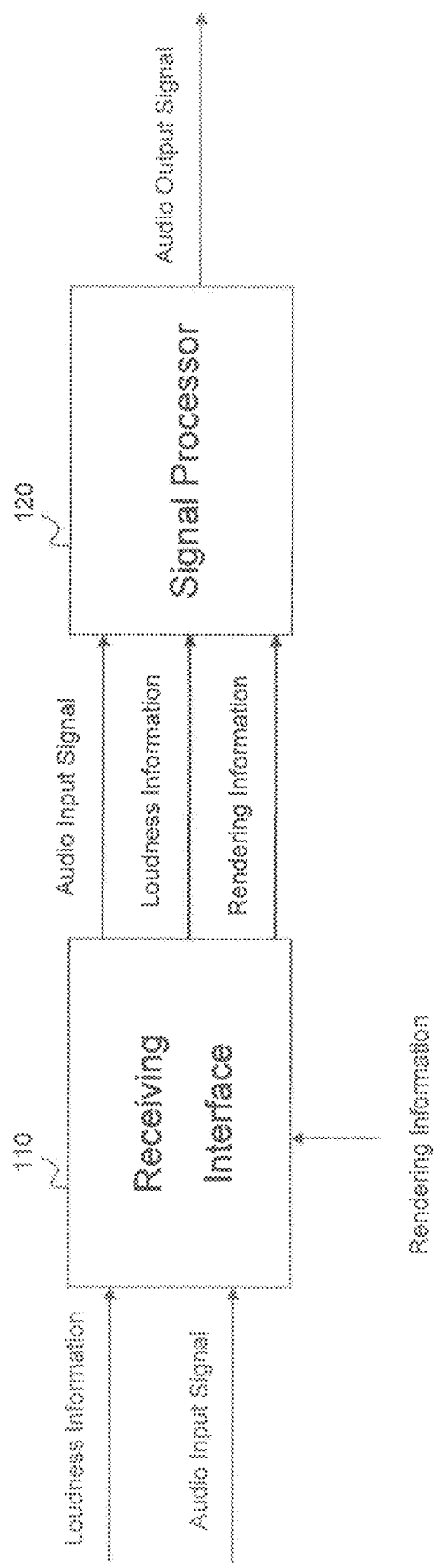
FIG. 1 illustrates a decoder for generating an audio output signal comprising one or more audio output channels according to an embodiment.

FIG. 1 illustrates a decoder for generating an audio output signal comprising one or more audio output channels according to an embodiment.

The decoder comprises a receiving interface 110 for receiving an audio input signal comprising a plurality of audio object signals, for receiving loudness information on the audio object signals, and for receiving rendering information indicating whether one or more of the audio object signals shall be amplified or attenuated.

Moreover, the decoder comprises a signal processor 120 for generating the one or more audio output channels of the audio output signal. The signal processor 120 is configured to determine a loudness compensation value depending on the loudness information and depending on the rendering information. Furthermore, the signal processor 120 is configured to generate the one or more audio output channels of the audio output signal from the audio input signal depending on the rendering information and depending on the loudness compensation value.

According to an embodiment, the signal processor 110 is configured to generate the one or more audio output channels of the audio output signal from the audio input signal depending on the rendering information and depending on the loudness compensation value, such that a loudness of the audio output signal is equal to a loudness of the audio input signal, or such that the loudness of the audio output signal is closer to the loudness of the audio input signal than a loudness of a modified audio signal that would result from modifying the audio input signal by amplifying or attenuating the audio object signals of the audio input signal according to the rendering information.

According to another embodiment, each of the audio object signals of the audio input signal is assigned to exactly one group of two or more groups, wherein each of the two or more groups comprises one or more of the audio object signals of the audio input signal.

In such an embodiment, the receiving interface 110 is configured to receive a loudness value for each group of the two or more groups as the loudness information, wherein said loudness value indicates an original total loudness of the one or more audio object signals of said group. Furthermore, the receiving interface 110 is configured to receive the rendering information indicating for at least one group of the two or more groups whether the one or more audio object signals of said group shall be amplified or attenuated by indicating a modified total loudness of the one or more audio object signals of said group. Moreover, in such an embodiment, the signal processor 120 is configured to determine the loudness compensation value depending on the modified total loudness of each of said at least one group of the two or more groups and depending on the original total loudness of each of the two or more groups. Furthermore, the signal processor 120 is configured to generate the one or more audio output channels of the audio output signal from the audio input signal depending on the modified total loudness of each of said at least one group of the two or more groups and depending on the loudness compensation value.

In particular embodiments, at least one group of the two or more groups comprises two or more of the audio object signals.

A direct relationship exists between the energy $e_i$ of an audio object signal i and the loudness $L_i$ of the audio object signal i according to the formulae:

$$L_i = c + 10 \log_{10} e_i, \quad e_i = 10^{(L_i - c)/10}$$

wherein c is a constant value.

Embodiments are based on the following findings: Different audio object signals of the audio input signal may have a different loudness and thus a different energy. If, e.g, a user wants to increase the loudness of one of the audio object signals, the rendering information may be correspondingly adjusted, and the increase of the loudness of this audio object signal increases the energy of this audio object. This would lead to an increased loudness of the audio output signal. To keep the total loudness constant, a loudness compensation has to be conducted. In other words, the modified audio signal that would result from applying the rendering information on the audio input signal would have to be adjusted. However, the exact effect of the amplification of one of the audio object signals on the total loudness of the modified audio signal depends on the original loudness of the amplified audio object signal, e.g., of the audio object signal, the loudness of which is increased. If the original loudness of this object corresponds to an energy, that was quite low, the effect on the total loudness of the audio input signal will be minor. If, however, the original loudness of this object corresponds to an energy, that was quite high, the effect on the total loudness of the audio input signal will be significant.

Two examples may be considered. In both examples, an audio input signal comprises two audio object signal, and in both examples, by applying the rendering information, the energy of a first one of the audio object signals is increased by 50%.

In the first example, the first audio object signal contributes 20% and the second audio object signal contributes 80% to the total energy of the audio input signal. However, in the second example, the first audio object, the first audio object signal contributes 40% and the second audio object signal contributes 60% to the total energy of the audio input signal. In both examples these contributions are derivable from the loudness information on the audio object signals, as a direct relationship exists between loudness and energy.

In the first example, an increase of 50% of the energy of the first audio object results in that a modified audio signal that is generated by applying the rendering information on the audio input signal has a total energy 1.5×20%+80%=110% of the energy of the audio input signal.

In the second example, an increase of 50% of the energy of the first audio object results in that the modified audio signal that is generated by applying the rendering information on the audio input signal has a total energy 1.5×40%+60%=120% of the energy of the audio input signal.

Thus, after applying the rendering information on the audio input signal, in the first example, the total energy of the modified audio signal has to be reduced by only 9% (10/110) to obtain equal energy in both the audio input signal and the audio output signal, while in the second example, the total energy of the modified audio signal has to be reduced by 17% (20/120). For this purpose, a loudness compensation value may be calculated.

For example, the loudness compensation value may be a scalar that is applied on all audio output channels of the audio output signal.

According to an embodiment, the signal processor is configured to generate the modified audio signal by modifying the audio input signal by amplifying or attenuating the audio object signals of the audio input signal according to the rendering information. Moreover, the signal processor is configured to generate the audio output signal by applying the loudness compensation value on the modified audio signal, such that the loudness of the audio output signal is equal to the loudness of the audio input signal, or such that the loudness of the audio output signal is closer to the loudness of the audio input signal than the loudness of the modified audio signal.

For example, in the first example above, the loudness compensation value lcv, may, for example, be set to a value lcv=10/11, and a multiplication factor of 10/11 may be applied on all channels that result from rendering the audio input channels according to the rendering information.

Accordingly, for example, in the second example above, the loudness compensation value lcv, may, for example, be set to a value lcv=10/12=5/6, and a multiplication factor of 5/6 may be applied on all channels that result from rendering the audio input channels according to the rendering information.

In other embodiments, each of the audio object signals may be assigned to one of a plurality of groups, and a loudness value may be transmitted for each of the groups indicating a total loudness value of the audio object signals of said group. If the rendering information specifies that the energy of one of the groups is attenuated or amplified, e.g., amplified by 50% as above, a total energy increase may be calculated and a loudness compensation value may be determined as described above.

For example, according to an embodiment, each of the audio object signals of the audio input signal is assigned to exactly one group of exactly two groups as the two or more groups. Each of the audio object signals of the audio input signal is either assigned to a foreground object group of the exactly two groups or to a background object group of the exactly to groups. The receiving interface 110 is configured to receive the original total loudness of the one or more audio object signals of the foreground object group. Moreover, the receiving interface 110 is configured to receive the original total loudness of the one or more audio object signals of the background object group. Furthermore, the receiving interface 110 is configured to receive the rendering information indicating for at least one group of the exactly two groups whether the one or more audio object signals of each of said at least one group shall be amplified or attenuated by indicating a modified total loudness of the one or more audio object signals of said group.

In such an embodiment, the signal processor 120 is configured to determine the loudness compensation value depending on the modified total loudness of each of said at least one group, depending on the original total loudness of the one or more audio object signals of the foreground object group, and depending on the original total loudness of the one or more audio object signals of the background object group. Moreover, the signal processor 120 is configured to generate the one or more audio output channels of the audio output signal from the audio input signal depending on the modified total loudness of each of said at least one group and depending on the loudness compensation value.

According to some embodiments, each of the audio object signals is assigned to one of three or more groups, and the receiving interface may be configured to receive a loudness value for each of the three or more groups indicating the total loudness of the audio object signals of said group.

According to an embodiment, to determine the total loudness value of two or more audio object signals, for example, the energy value corresponding to the loudness value is determined for each audio object signal, the energy values of all loudness values are summed up to obtain an energy sum, and the loudness value corresponding to the energy sum is determined as the total loudness value of the two or more audio object signals. For example, the formulae $$L_i = c + 10 \log_{10} e_i, \quad e_i = 10^{(L_i - c)/10}$$

may be employed.

In some embodiments, loudness values are transmitted for each of the audio object signals, or each of the audio object signals is assigned to one or two or more groups, wherein for each of the groups, a loudness value is transmitted.

However, in some embodiments, for one or more audio object signals or for one or more of the groups comprising audio object signals, no loudness value is transmitted. Instead, the decoder may, for example, assume that these audio object signals or groups of audio object signals, for which no loudness value is transmitted, have a predefined loudness value. The decoder may, e.g., base all further determinations on this predefined loudness value.

According to an embodiment, the receiving interface 110 is configured to receive a downmix signal comprising one or more downmix channels as the audio input signal, wherein the one or more downmix channels comprise the audio object signals, and wherein the number of the audio object signals is smaller than the number of the one or more downmix channels. The receiving interface 110 is configured to receive downmix information indicating how the audio object signals are mixed within the one or more downmix channels. Moreover, the signal processor 120 is configured to generate the one or more audio output channels of the audio output signal from the audio input signal depending on the downmix information, depending on the rendering information and depending on the loudness compensation value. In a particular embodiment, the signal processor 120 may, for example, be configured to calculate the loudness compensation value depending on the downmix information.

For example, the downmix information may be a downmix matrix. In embodiments, the decoder may be an SAOC decoder. In such embodiments, the receiving interface 110 may, e.g., be further configured to receive covariance information, e.g., a covariance matrix as described above.

With respect to the rendering information indicating whether one or more of the audio object signals shall be amplified or attenuated, it should be noted that for example, information that indicates how one or more of the audio object signals shall be amplified or attenuated, is rendering information. For example, a rendering matrix R, e.g., a rendering matrix of SAOC, is rendering information.

Figure 3:
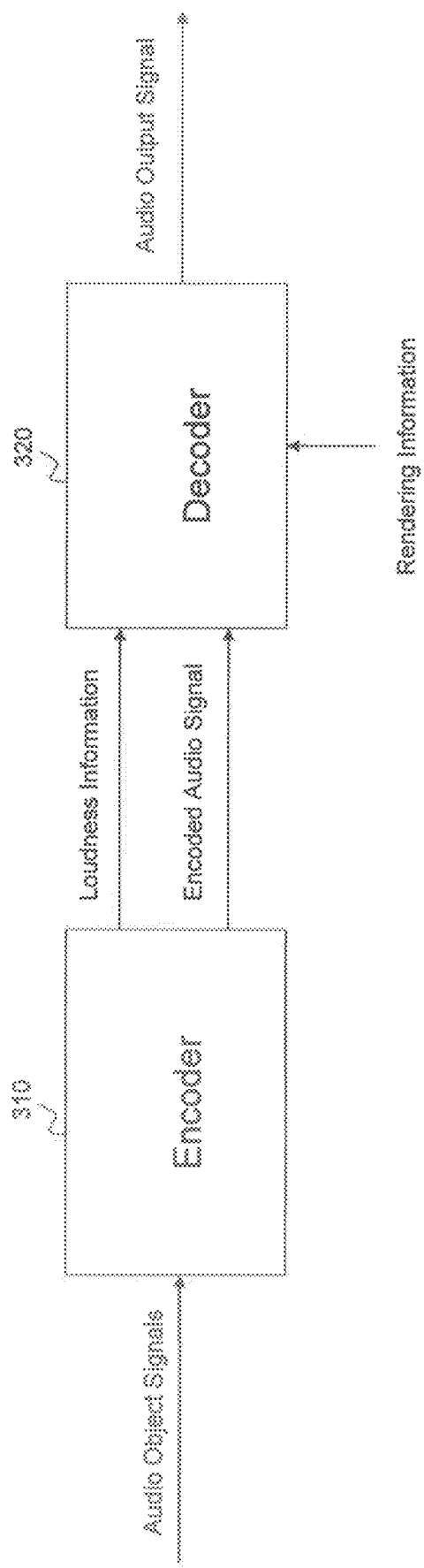
FIG. 3 illustrates a system according to an embodiment.

FIG. 3 illustrates a system according to an embodiment.

The system comprises an encoder 310 according to one of the above-described embodiments for encoding a plurality of audio object signals to obtain an encoded audio signal comprising the plurality of audio object signals.

Moreover, the system comprises a decoder 320 according to one of the above-described embodiments for generating an audio output signal comprising one or more audio output channels. The decoder is configured to receive the encoded audio signal as an audio input signal and the loudness information. Moreover, the decoder 320 is configured to further receive rendering information. Furthermore, the decoder 320 is configured to determine a loudness compensation value depending on the loudness information and depending on the rendering information. Moreover, the decoder 320 is configured to generate the one or more audio output channels of the audio output signal from the audio input signal depending on the rendering information and depending on the loudness compensation value.

Figure 7:
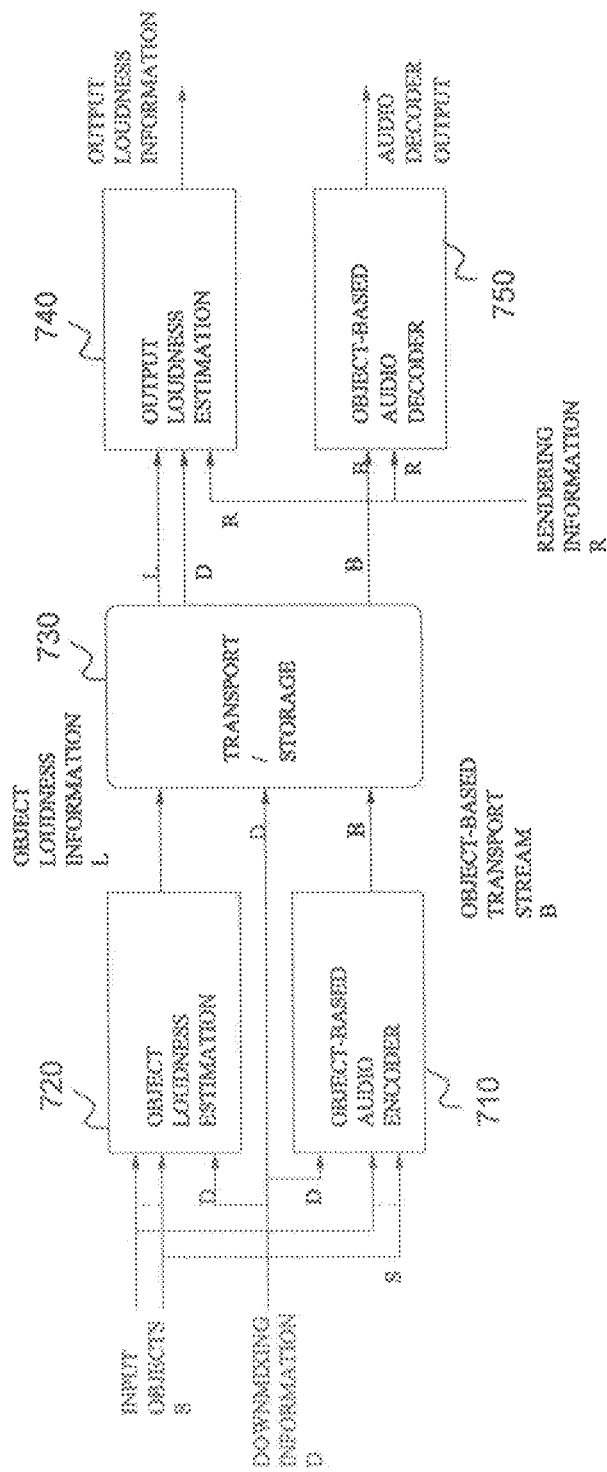
FIG. 7 depicts informed loudness estimation according to an embodiment, illustrating components of an encoder and a decoder according to an embodiment.

FIG. 7 illustrates informed loudness estimation according to an embodiment. On the left of transport stream 730, components of an object-based audio coding encoder are illustrated. In particular, an object-based encoding unit 710 ("object-based audio encoder") and an object loudness encoding unit 720 is illustrated ("object loudness estimation").

The transport stream 730 itself comprises loudness information L, downmixing information D and the output of the object-based audio encoder 710B.

On the right of transport stream 730, components of a signal processor of an object-based audio coding decoder are illustrated. The receiving interface of the decoder is not illustrated. An output loudness estimator 740 and an object-based audio decoding unit 750 is depicted. The output loudness estimator 740 may be configured to determine the loudness compensation value. The object-based audio decoding unit 750 may be configured to determine a modified audio signal from an audio signal, being input to the decoder, by applying the rendering information R. Applying the loudness compensation value on the modified audio signal to compensate a total loudness change caused by the rendering is not shown in FIG. 7.

The input to the encoder consists of the input objects S in the minimum. The system estimates the loudness of each object (or some other loudness-related information, such as the object energies), e.g., by the object loudness encoding unit 720, and this information L is transmitted and/or stored. (It is also possible, the loudness of the objects is provided as an input to the system, and the estimation step within the system can be omitted).

In the embodiment of FIG. 7, the decoder receives at least the object loudness information and, e.g., the rendering information R describing the mixing of the objects into the output signal. Based on these, e.g., the output loudness estimator 740, estimates the loudness of the output signal and provides this information as its output.

The downmixing information D may be provided as the rendering information, in which case the loudness estimation provides an estimate of the downmix signal loudness. It is also possible to provide the downmixing information as an input to the object loudness estimation, and to transmit and/or store it along the object loudness information. The output loudness estimation can then estimate simultaneously the loudness of the downmix signal and the rendered output and provide these two values or their difference as the output loudness information. The difference value (or its inverse) describes the useful compensation that should be applied on the rendered output signal for making its loudness similar to the loudness of the downmix signal. The object loudness information can additionally include information regarding the correlation coefficients between various objects and this correlation information can be used in the output loudness estimation for a more accurate estimate.

In the following, an embodiment for dialogue enhancement application is described.

In the dialogue enhancement application, as described above, the input audio object signals are grouped and partially downmixed to form two meta-objects, FGO and BGO, which can then be trivially summed for obtaining the final downmix signal.

Following the description of SAOC [SAOC], N input object signals are represented as a matrix S of the size $N \times N_{samples}$, and the downmixing information as a matrix D of the size M×N. The downmix signals can then be obtained as X=DS.

The downmixing information D can now be divided into two parts $$D = D_{FGO} + D_{BGO}$$

for the meta-objects.

As each column of the matrix D corresponds to an original audio object signal, the two component downmix matrices can be obtained by setting the columns, which correspond to the other meta-object into zero (assuming that no original object may be present in both meta-objects). In other words, the columns corresponding to the meta-object BGO are set to zero in $D_{FGO}$, and vice versa.

These new downmixing matrices describe the way the two meta-objects can be obtained from the input objects, namely:

$$S_{FGO} = D_{FGO} S \text{ and } S_{BGO} = D_{BGO} S,$$

and the actual downmixing is simplified to $$X = S_{FGO} + S_{BGO}.$$

It can be also considered that the object (e.g., SAOC) decoder attempts to reconstruct the meta-objects:

$$\tilde{S}_{FGO} \approx S_{FGO} \text{ and } \tilde{S}_{BGO} \approx S_{BGO},$$

and the DE-specific rendering can be written as a combination of these two meta-object reconstructions:

$$Y = g_{FGO} S_{FGO} + g_{BGO} S_{BGO} \approx g_{FGO} \tilde{S}_{FGO} + g_{BGO} \tilde{S}_{BGO}.$$

The object loudness estimation receives the two meta-objects $S_{FGO}$ and $S_{BGO}$ as the input and estimates the loudness of each of them: $L_{FGO}$ being the (total/overall) loudness of $S_{FGO}$, and $L_{BGO}$ being the (total/overall) loudness of $S_{BGO}$. These loudness values are transmitted and/or stored.

As an alternative, using one of the meta-objects, e.g., the FGO, as reference, it is possible to calculate the loudness difference of these two objects, e.g., as $$\Delta L_{FGO} = L_{BGO} - L_{FGO}.$$

This single value is then transmitted and/or stored.

Figure 8:
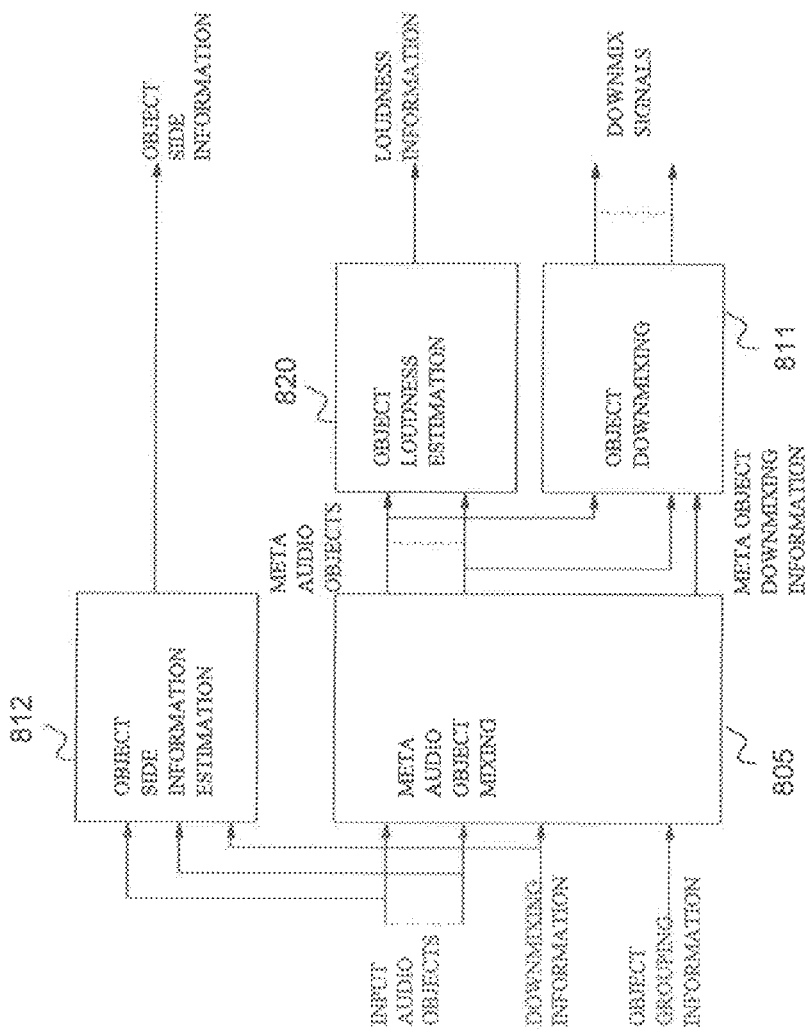
FIG. 8 illustrates an encoder according to another embodiment.

FIG. 8 illustrates an encoder according to another embodiment. The encoder of FIG. 8 comprises an object downmixer 811 and an object side information estimator 812. Furthermore, the encoder of FIG. 8 further comprises an object loudness encoding unit 820. Moreover, the encoder of FIG. 8 comprises a meta audio object mixer 805.

The encoder of FIG. 8 uses intermediate audio meta-objects as an input to the object loudness estimation. In embodiments, the encoder of FIG. 8 may be configured to generate two audio meta-objects. In other embodiments, the encoder of FIG. 8 may be configured to generate three or more audio meta-objects.

Inter alia, the provided concepts provide the new feature that the encoder may, e.g., estimates the average loudness of all input objects. The objects may, e.g., be mixed into a downmix signal that is transmitted. The provided concepts moreover provide the new feature that the object loudness and the downmixing information may, e.g., be included in the object-coding side information that is transmitted.

The decoder may, e.g., use the object-coding side information for (virtual) separation of the objects and re-combines the objects using the rendering information.

Furthermore, the provided concepts provide the new feature that either the downmixing information can be used to estimate the loudness of the default downmix signal, the rendering information and the received object loudness can be used for estimating the average loudness of the output signal, and/or the loudness change can be estimated from these two values. Or, the downmixing and rendering information can be used to estimate the loudness change from the default downmix, another new feature of the provided concepts.

Furthermore, the provided concepts provide the new feature that the decoder output can be modified to compensate for the change in the loudness so that the average loudness of the modified signal matches the average loudness of the default downmix.

Figure 9:
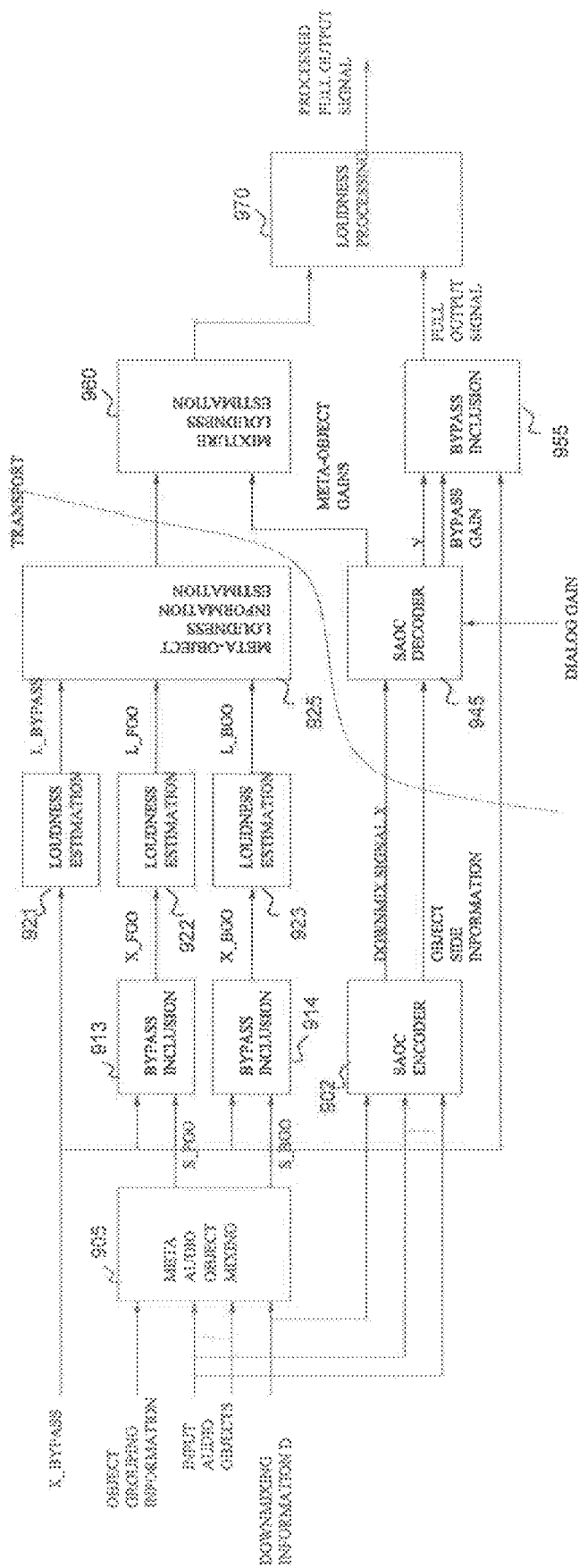
FIG. 9 illustrates an encoder and a decoder according to an embodiment related to the SAOC-Dialog Enhancement, which comprises bypass channels.

A specific embodiment related to SAOC-DE is illustrated in FIG. 9. The system receives the input audio object signals, the downmixing information, and the information of the grouping of the objects to meta-objects. Based on these, the meta audio object mixer 905 forms the two meta-objects $S_{FGO}$ and $S_{BGO}$. It is possible, that the portion of the signal that is processed with SAOC, does not constitute the entire signal. For example, in a 5.1 channel configuration, SAOC may be deployed on a sub-set of channels, like on the front channel (left, right, and center), while the other channels (left surround, right surround, and low-frequency effects) are routed around, (by-passing) the SAOC and delivered as such. These channels not processed by SAOC are denoted with $X_{BYPASS}$. The possible by-pass channels need to be provided for the encoder for more accurate estimation of the loudness information.

The by-pass channels may be handled in various ways.

For example, the by-pass channels may, e.g., form an independent meta-object. This allows defining the rendering so that all three meta-objects are scaled independently.

Or, for example, the by-pass channels may, e.g., be combined with one of the other two meta-objects. The rendering settings of that meta-object control also the by-pass channel portion. For example, in the dialogue enhancement scenario, it may be meaningful to combine the by-pass channels with the background meta-object: $X_{BGO}=S_{BGO}+X_{BYPASS}$.

Or, for example, the by-pass channels may, e.g., be ignored.

According to embodiments, the object-based encoding unit 210 of the encoder is configured to receive the audio object signals, wherein each of the audio object signals is assigned to exactly one of exactly two groups, wherein each of the exactly two groups comprises one or more of the audio object signals. Moreover, the object-based encoding unit 210 is configured to downmix the audio object signals, being comprised by the exactly two groups, to obtain a downmix signal comprising one or more downmix audio channels as the encoded audio signal, wherein the number of the one or more downmix channels is smaller than the number of the audio object signals being comprised by the exactly two groups. The object loudness encoding unit 220 is assigned to receive one or more further by-pass audio object signals, wherein each of the one or more further by-pass audio object signals is assigned to a third group, wherein each of the one or more further by-pass audio object signals is not comprised by the first group and is not comprised by the second group, wherein the object-based encoding unit 210 is configured to not downmix the one or more further by-pass audio object signals within the downmix signal.

In an embodiment, the object loudness encoding unit 220 is configured to determine a first loudness value, a second loudness value and a third loudness value of the loudness information, the first loudness value indicating a total loudness of the one or more audio object signals of the first group, the second loudness value indicating a total loudness of the one or more audio object signals of the second group, and the third loudness value indicating a total loudness of the one or more further by-pass audio object signals of the third group. In an another embodiment, the object loudness encoding unit 220 is configured to determine a first loudness value and a second loudness value of the loudness information, the first loudness value indicating a total loudness of the one or more audio object signals of the first group, and the second loudness value indicating a total loudness of the one or more audio object signals of the second group and of the one or more further by-pass audio object signals of the third group.

According to an embodiment, the receiving interface 110 of the decoder is configured to receive the downmix signal. Moreover, the receiving interface 110 is configured to receive one or more further by-pass audio object signals, wherein the one or more further by-pass audio object signals are not mixed within the downmix signal. Furthermore, the receiving interface 110 is configured to receive the loudness information indicating information on the loudness of the audio object signals which are mixed within the downmix signal and indicating information on the loudness of the one or more further by-pass audio object signals which are not mixed within the downmix signal. Moreover, the signal processor 120 is configured to determine the loudness compensation value depending on the information on the loudness of the audio object signals which are mixed within the downmix signal, and depending on the information on the loudness of the one or more further by-pass audio object signals which are not mixed within the downmix signal.

FIG. 9 illustrates an encoder and a decoder according to an embodiment related to the SAOC-DE, which comprises by-pass channels. Inter alia, the encoder of FIG. 9 comprises an SAOC encoder 902.

In the embodiment of FIG. 9, the possible combining of the by-pass channels with the other meta-objects takes place in the two "bypass inclusion" blocks 913, 914, producing the meta-objects $X_{FGO}$ and $X_{BGO}$ with the defined parts from the by-pass channels included.

The perceptual loudness $L_{BYPASS}$, $L_{FGO}$, and $L_{BGO}$ of both of these meta-objects are estimated in the loudness estimation units 921, 922, 923. This loudness information is then transformed into an appropriate encoding in a meta-object loudness information estimator 925 and then transmitted and/or stored.

The actual SAOC en- and decoder operate as expected extracting the object side information from the objects, creating the downmix signal X, and transmitting and/or storing the information to the decoder. The possible by-pass channels are transmitted and/or stored along the other information to the decoder.

The SAOC-DE decoder 945 receives a gain value "Dialog gain" as a user-input. Based on this input and the received downmixing information, the SAOC decoder 945 determines the rendering information. The SAOC decoder 945 then produces the rendered output scene as the signal Y. In addition to that, it produces a gain factor (and a delay value) that should be applied on the possible by-pass signals $X_{BYPASS}$.

The "bypass inclusion" unit 955 receives this information along with the rendered output scene and the by-pass signals and creates the full output scene signal. The SAOC decoder 945 produces also a set of meta-object gain values, the amount of these depending on the meta-object grouping and desired loudness information form.

The gain values are provided to the mixture loudness estimator 960 which also receives the meta-object loudness information from the encoder.

The mixture loudness estimator 960 is then able to determine the desired loudness information, which may include, but is not limited to, the loudness of the downmix signal, the loudness of the rendered output scene, and/or the difference in the loudness between the downmix signal and the rendered output scene.

In some embodiments, the loudness information itself is enough, while in other embodiments, it is desirable to process the full output depending on the determined loudness information. This processing may, for example, be compensation of any possible difference in the loudness between the downmix signal and the rendered output scene. Such a processing, e.g., by a loudness processing unit 970, would make sense in the broadcast scenario, as it would reduce the changes in the perceived signal loudness regardless of the user interaction (setting of the input "dialog gain").

The loudness-related processing in this specific embodiment comprises the a plurality of new features. Inter alia, the FGO, BGO, and the possible by-pass channels are pre-mixed into the final channel configuration so that the downmixing can be done by simply adding the two pre-mixed signals together (e.g., downmix matrix coefficients of 1), which constitutes a new feature. Moreover, as a further new feature, the average loudness of the FGO and BGO are estimated, and the difference is calculated. Furthermore, the objects are mixed into a downmix signal that is transmitted. Moreover, as a further new feature, the loudness difference information is included to the side information that is transmitted. (new) Furthermore, the decoder uses the side information for (virtual) separation of the objects and re-combines the objects using the rendering information which is based on the downmixing information and the user input modification gain. Moreover, as another new feature, the decoder uses the modification gain and the transmitted loudness information for estimating the change in the average loudness of the system output compared to the default downmix.

In the following, a formal description of embodiments is provided.

Assuming that the object loudness values behave similar to the logarithm of energy values when summing the objects, i.e., the loudness values have to be transformed into linear domain, added there, and finally transformed back to the logarithmic domain. Motivating this through the definition of BS.1770 loudness measure will now be presented (for simplicity, the number of channels is set to one, but the same principle can be applied on multi-channel signals with appropriate summing over channels).

The loudness of the $i^{th}$ K-filtered signal $z_i$ with the mean-squared energy $e_i$ is defined as $$L_i = c + 10 \log_{10} e_i,$$

wherein c is an offset constant. For example, c may be −0.691. From this follows that the energy of the signal can be determined from the loudness with $$e_i = 10^{(L_i - c)/10}.$$

The energy of the sum of N uncorrelated signals $$z_{SUM} = \sum_{i=1}^{N} z_i$$

is then $$e_{SUM} = \sum_{i=1}^{N} e_i = \sum_{i=1}^{N} 10^{(L_i - c)/10},$$

and the loudness of this sum signal is then $$L_{SUM} = c + 10 \log_{10} e_{SUM} = c + 10 \log_{10} \sum_{i=1}^{N} 10^{(L_i - c)/10}.$$

If the signals are not uncorrelated, the correlation coefficients $C_{i,j}$ have to be taken into account when approximating the energy of the sum signal as $$e_{SUM} = \sum_{i=1}^{N} \sum_{j=1}^{N} e_{i,j},$$

wherein the cross-energy $e_{i,j}$ between the $i^{th}$ and $j^{th}$ objects is defined as $$e_{i,j} = C_{i,j} \sqrt{e_i e_j}$$
$$= C_{i,j} \sqrt{10^{(L_i - c)/10} 10^{(L_j - c)/10}},$$
$$= C_{i,j} \sqrt{10^{(L_i + L_j - 2c)/10}}$$

wherein $-1 \leq C_{i,j} \leq 1$ is the correlation coefficient between the two objects i and j. When two objects are uncorrelated, the correlation coefficient equals to 0, and when the two objects are identical, the correlation coefficient equals to 1.

Further extending the model with mixing weights $g_i$ to be applied on the signals in the mixing process, i.e., $$z_{SUM} = \sum_{i=1}^{N} g_i z_i,$$

the energy of the sum signal will be $$e_{SUM} = \sum_{i=1}^{N} \sum_{j=1}^{N} g_i g_j e_{i,j},$$

and the loudness of the mixture signal can be obtained from this, as earlier, with $$L_{SUM} = c + 10 \log_{10} e_{SUM}.$$

The difference between the loudness of two signals can be estimated as $$\Delta L(i,j) = L_i - L_j.$$

If the definition of loudness is now used as earlier, this can be written as $$\Delta L(i, j) = L_i - L_j$$

-continued
$$= (c + 10\log_{10} e_i) - (c + 10\log_{10} e_j),$$
$$= 10\log_{10} \frac{e_i}{e_j}$$

which can be observed to be a function of signal energies. If it is now desired to estimate the loudness difference between two mixtures $$z_A = \sum_{i=1}^{N} g_i z_i \text{ and } z_B = \sum_{i=1}^{N} h_i z_i$$

with possibly differing mixing weights $g_i$ and $h_i$, this can be estimated with $$\Delta L(A, B) = 10\log_{10} \frac{e_A}{e_B}$$

$$= 10\log_{10} \frac{\sum_{i=1}^{N}\sum_{j=1}^{N} g_i g_j e_{i,j}}{\sum_{i=1}^{N}\sum_{j=1}^{N} h_i h_j e_{i,j}}$$

$$= 10\log_{10} \frac{\sum_{i=1}^{N}\sum_{j=1}^{N} g_i g_j C_{i,j} \sqrt{10^{(L_i+L_j-2c)/10}}}{\sum_{i=1}^{N}\sum_{j=1}^{N} h_i h_j C_{i,j} \sqrt{10^{(L_i+L_j-2c)/10}}}$$

$$= 10\log_{10} \frac{\sum_{i=1}^{N}\sum_{j=1}^{N} g_i g_j C_{i,j} \sqrt{10^{(L_i+L_j)/10}}}{\sum_{i=1}^{N}\sum_{j=1}^{N} h_i h_j C_{i,j} \sqrt{10^{(L_i+L_j)/10}}}.$$

In the case the objects are uncorrelated ($C_{i,j}=0$, $\forall i \neq j$ and $C_{i,j}=1$, $\forall i=j$), the difference estimate becomes $$\Delta L(A, B) = 10\log_{10} \frac{\sum_{i=1}^{N} g_i^2 10^{(L_i-c)/10}}{\sum_{i=1}^{N} h_i^2 10^{(L_i-c)/10}}$$

$$= 10\log_{10} \frac{\sum_{i=1}^{N} g_i^2 10^{L_i/10}}{\sum_{i=1}^{N} h_i^2 10^{L_i/10}}.$$

In the following, differential encoding is considered.

It is possible to encode the per-object loudness values as differences from the loudness of a selected reference object:

$$K_i = L_i - L_{REF},$$

wherein $L_{REF}$ is the loudness of the reference object. This encoding is beneficial if no absolute loudness values are needed as the result, because it is now useful to transmit one value less, and the loudness difference estimation can be written as $$\Delta L(A, B) = 10\log_{10} \frac{\sum_{i=1}^{N}\sum_{j=1}^{N} g_i g_j C_{i,j} \sqrt{10^{(K_i+K_j)/10}}}{\sum_{i=1}^{N}\sum_{j=1}^{N} h_i h_j C_{i,j} \sqrt{10^{(K_i+K_j)/10}}},$$

or in the case of uncorrelated objects $$\Delta L(A, B) = 10\log_{10} \frac{\sum_{i=1}^{N} g_i^2 10^{K_i/10}}{\sum_{i=1}^{N} h_i^2 10^{K_i/10}}.$$

In the following, a dialogue enhancement scenario is considered.

Considering again the application scenario of dialogue enhancement. The freedom of defining the rendering information in the decoder is limited only into changing the levels of the two meta-objects. Let us furthermore assume that the two meta-objects are uncorrelated, i.e., $C_{FGO,BGO}=0$. If the downmixing weights of the meta-objects are $h_{FGO}$ and $h_{BGO}$, and they are rendered with the gains $f_{FGO}$ and $f_{BGO}$, the loudness of the output relative to the default downmix is $$\Delta L(A, B) = 10\log_{10} \frac{f_{FGO}^2 10^{(L_{FGO}-c)/10} + f_{BGO}^2 10^{(L_{BGO}-c)/10}}{h_{FGO}^2 10^{(L_{FGO}-c)/10} + h_{BGO}^2 10^{(L_{BGO}-c)/10}}$$

$$= 10\log_{10} \frac{f_{FGO}^2 10^{L_{FGO}/10} + f_{BGO}^2 10^{L_{BGO}/10}}{h_{FGO}^2 10^{L_{FGO}/10} + h_{BGO}^2 10^{L_{BGO}/10}}.$$

This is then also the useful compensation if it is desired to have the same loudness in the output as in the default downmix.

$\Delta L(A, B)$ may be considered as a loudness compensation value, that may be transmitted by the signal processor 120 of the decoder. $\Delta L(A, B)$ can also be named as a loudness change value and thus the actual compensation value can be an inverse value. Or is it ok to use the "loudness compensation factor" name for it, too? Thus, the loudness compensation value Icy mentioned earlier in this document would correspond the value $g_{Delta}$ below.

For example, $g_\Delta = 10^{-\Delta L(A,B)/20}$ $1/\Delta L(A, B)$ may be applied as a multiplication factor on each channel of a modified audio signal that results from applying the rendering information on the audio input signal. This equation for $g_{Delta}$ works in the linear domain. In the logarithmic domain, the equation would be different such as $1/\Delta L(A, B)$ and applied accordingly.

If the downmixing process is simplified such that the two meta-objects can be mixed with unity weights for obtaining the downmix signal, i.e., $h_{FGO}=h_{BGO}=1$, and now the rendering gains for these two objects are denoted with $g_{FGO}$ and $g_{BGO}$. This simplifies the equation for the loudness change into $$\Delta L(A, B) = 10\log_{10} \frac{g_{FGO}^2 10^{(L_{FGO}-c)/10} + g_{BGO}^2 10^{(L_{BGO}-c)/10}}{10^{(L_{FGO}-c)/10} + 10^{(L_{BGO}-c)/10}}$$

$$= 10\log_{10} \frac{g_{FGO}^2 10^{L_{FGO}/10} + g_{BGO}^2 10^{L_{BGO}/10}}{10^{L_{FGO}/10} + 10^{L_{BGO}/10}}.$$

Again, ΔL(A, B) may be considered as a loudness compensation value that is determined by the signal processor 120.

In general, $g_{FGO}$ may be considered as a rendering gain for the foreground object FGO (foreground object group), and $g_{BGO}$ may be considered as a rendering gain for the background object BGO (background object group).

As mentioned earlier, it is possible to transmit loudness differences instead of absolute loudness. Let us define the reference loudness as the loudness of the FGO meta-object $L_{REF} = L_{FGO}$, i.e., $K_{FGO} = L_{FGO} - L_{REF} = 0$ and $K_{BGO} = L_{BGO} - L_{REF} = L_{BGO} - L_{FGO}$. Now, the loudness change is $$\Delta L(A, B) = 10 \log_{10} \frac{g_{FGO}^2 + g_{BGO}^2 10^{K_{BGO}/10}}{1 + 10^{K_{BGO}/10}}.$$

It may also be, as the case in the SAOC-DE is, that two meta-objects do not have individual scaling factors, but one of the objects is left un-modified, while the other is attenuated to obtain the correct mixing ratio between the objects. In this rendering setting, the output will be lower in loudness than the default mixture, and the change in the loudness is $$\Delta L(A, B) = 10 \log_{10} \frac{\hat{g}_{FGO}^2 + \hat{g}_{BGO}^2 10^{K_{BGO}/10}}{1 + 10^{K_{BGO}/10}}, \text{ with}$$

$$\hat{g}_{FGO} = \begin{cases} 1, & \text{if } g_{FGO} \geq g_{BGO} \\ \frac{g_{FGO}}{g_{BGO}}, & \text{if } g_{FGO} < g_{BGO} \end{cases}, \text{ and}$$

$$\hat{g}_{BGO} = \begin{cases} \frac{g_{BGO}}{g_{FGO}}, & \text{if } g_{BGO} < g_{FGO} \\ 1, & \text{if } g_{BGO} \geq g_{FGO} \end{cases}.$$

This form is already rather simple, and is rather agnostic regarding the loudness measure used. The only real requirement is, that the loudness values should sum in the exponential domain. It is possible to transmit/store values of signal energies instead of loudness values, as the two have close connection.

In each of the above formulae, ΔL(A, B) may be considered as a loudness compensation value, that may be transmitted by the signal processor 120 of the decoder.

In the following, example cases are considered. The accuracy of the provided concepts is illustrated through two example signals. Both signals have a 5.1 downmix with the surround and LFE channels by-passed from the SAOC processing.

Two main approaches are used: one ("3-term") with three meta-objects: FGO, BGO, and by-pass channels, e.g., $$X = X_{FGO} + X_{BGO} + X_{BYPASS},$$

And another one ("2-term") with two meta-objects, e.g.:

$$X = X_{FGO} + X_{BGO}.$$

In the 2-term approach, the by-pass channels may, e.g., be mixed together with the BGO for the meta-object loudness estimation. The loudness of both (or all three) objects as well as the loudness of the downmix signal are estimated, and the values are stored.

The rendering instructions are of form $$Y = \hat{g}_{FGO} X_{FGO} + \hat{g}_{BGO} X_{BGO} + \hat{g}_{BGO} X_{BYPASS}$$

and $$Y = \hat{g}_{FGO} X_{FGO} + \hat{g}_{BGO} X_{BGO}$$

for the two approaches respectively.

The gain values are, e.g., determined according to:

$$\hat{g}_{FGO} = \begin{cases} 1, & \text{if } g_{FGO} > 1 \\ g_{FGO}, & \text{otherwise} \end{cases}, \text{ and}$$

$$\hat{g}_{BGO} = \begin{cases} 1/g_{FGO}, & \text{if } g_{FGO} > 1 \\ 1, & \text{otherwise} \end{cases},$$

wherein the FGO gain $g_{FGO}$ is varied between −24 to +24 dB.

The output scenario is rendered, the loudness is measured, and the attenuation from the loudness of the downmix signal is calculated.

Figure 10:
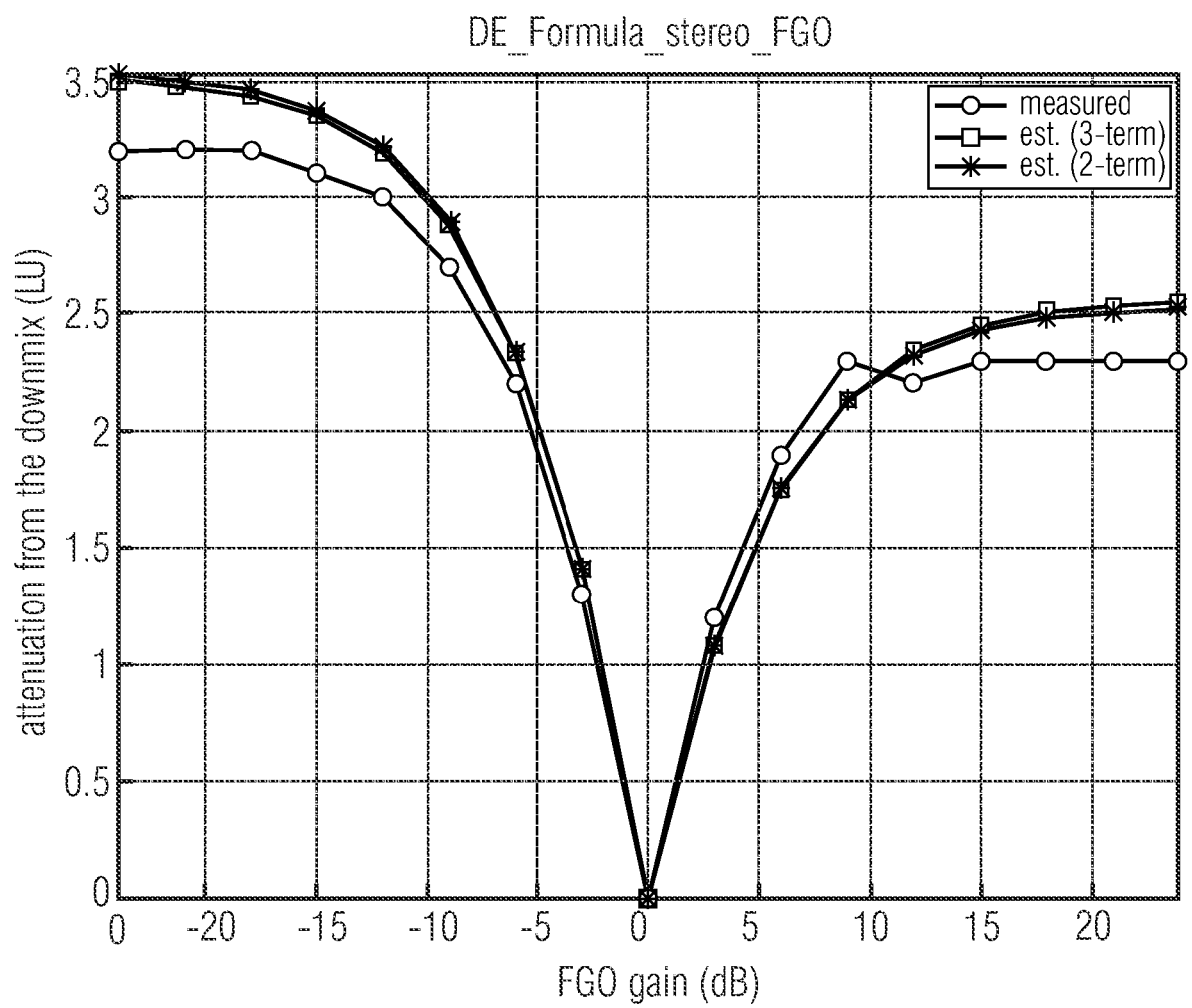
FIG. 10 depicts a first illustration of a measured loudness change and the result of using the provided concepts for estimating the change in the loudness in a parametrical manner.
Figure 11:
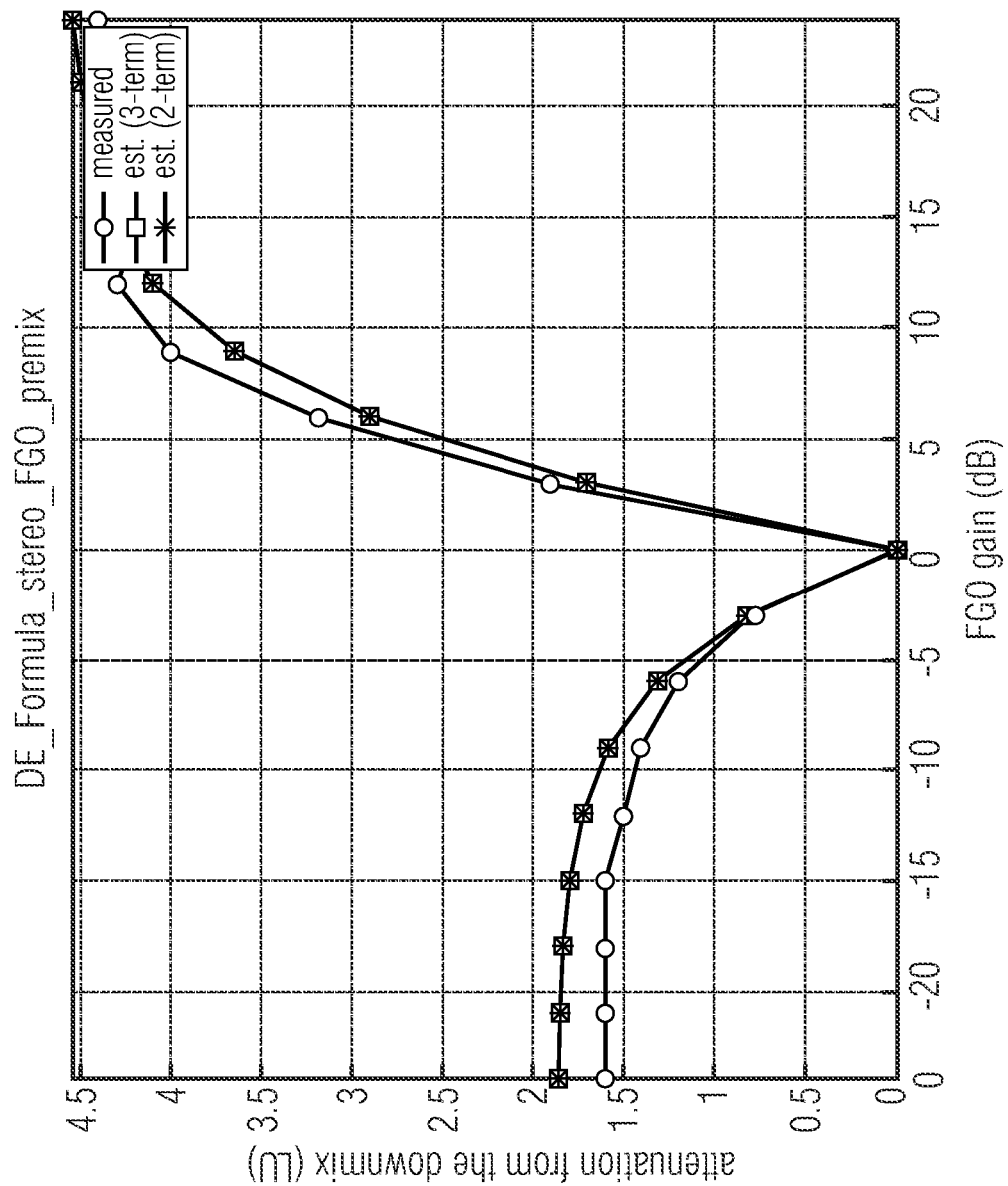
FIG. 11 depicts a second illustration of a measured loudness change and the result of using the provided concepts for estimating the change in the loudness in a parametrical manner.

This result is displayed in FIG. 10 and FIG. 11 with the blue line with circle markers. FIG. 10 depicts a first illustration and FIG. 11 depicts a second illustration of a measured loudness change and the result of using the provided concepts for estimating the change in the loudness in a purely parametrical manner.

Next, the attenuation from the downmix is estimated parametrically employing the stored meta-object loudness values and the downmixing and rendering information. The estimate using the loudness of three meta-objects is illustrated with the green line with square markers, and the estimate using the loudness of two meta-objects is illustrated with the red line with star markers.

It can be seen from the figures, that the 2- and 3-term approaches provide practically identical results, and they both approximate the measured value quite well.

The provided concepts exhibit a plurality of advantages. For example, the provided concepts allow estimating the loudness of a mixture signal from the loudness of the component signals forming the mixture. The benefit of this is that the component signal loudness can be estimated once, and the loudness estimate of the mixture signal can be obtained parametrically for any mixture without the need of actual signal-based loudness estimation. This provides a considerable improvement in the computational efficiency of the overall system in which the loudness estimate of various mixtures is needed. For example, when the end-user changes the rendering settings, the loudness estimate of the output is immediately available.

In some applications, such as when conforming with the EBU R128 recommendation, the average loudness over the entire program is important. If the loudness estimation in the receiver, e.g., in a broadcast scenario, is done based on the received signal, the estimate converges to the average loudness only after the entire program has been received. Because of this, any compensation of the loudness will have errors or exhibit temporal variations. When estimating the loudness of the component objects as proposed and transmitting the loudness information, it is possible to estimate the average mixture loudness in the receiver without a delay.

If it is desired that the average loudness of the output signal remains (approximately) constant regardless of the changes in the rendering information, the provided concepts allow determining a compensation factor for this reason. The calculations needed for this in the decoder are from their computational complexity negligible, and the functionality is thus possible to be added to any decoder.

There are cases in which the absolute loudness level of the output is not important, but the importance lies in determining the change in the loudness from a reference scene. In such cases the absolute levels of the objects are not important, but their relative levels are. This allows defining one of the objects as the reference object and representing the loudness of the other objects in relation to the loudness of this reference object. This has some benefits considering the transport and/or storage of the loudness information.

First of all, it is not necessary to transport the reference loudness level. In the application case of two meta-objects, this halves the amount of data to be transmitted. The second benefit relates to the possible quantization and representation of the loudness values.

Since the absolute levels of the objects can be almost anything, the absolute loudness values can also be almost anything. The relative loudness values, on the other hand, are assumed to have a 0 mean and a rather nicely formed distribution around the mean. The difference between the representations allows defining the quantization grid of the relative representation in a way with potentially greater accuracy with the same number of bits used for the quantized representation.

Figure 12:
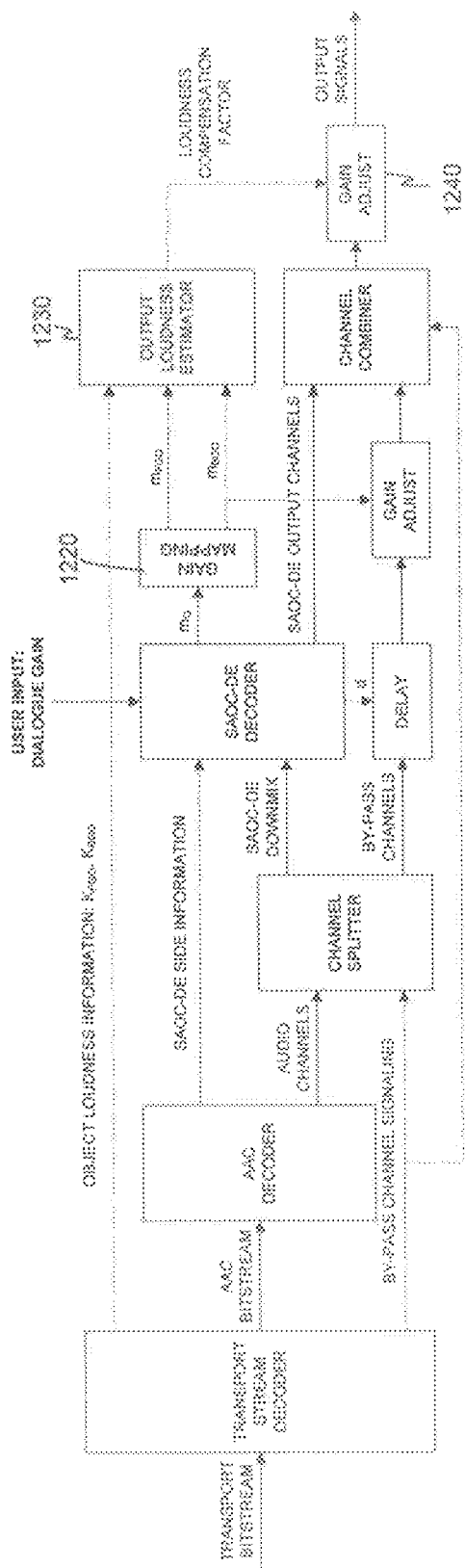
FIG. 12 illustrates another embodiment for conducting loudness compensation.

FIG. 12 illustrates another embodiment for conducting loudness compensation. In FIG. 12, loudness compensation may be conducted, e.g., to compensate the loss in loudness, For this purpose, e.g., the values DE_loudness_diff_dialogue (=$K_{FGO}$) and DE_loudness_diff_background (=$K_{BGO}$) from DE_control_info may be used. Here, DE_control_info may specify Advanced Clean Audio "Dialogue Enhancement" (DE) control information The loudness compensation is achieved by applying a gain value "g" on the SAOC-DE output signal and the by-passed channels (in case of a multichannel signal).

In the embodiment of FIG. 12, this is done as follows:

A limited dialogue modification gain value $m_G$ is used to determine the effective gains for the foreground object (FGO, e.g., dialogue) and for the background object (BGO, e.g., ambiance). This is done by the "Gain mapping" block 1220 which produces the gain values $m_{FGO}$ and $m_{BGO}$.

The "Output loudness estimator" block 1230 uses the loudness information $K_{FGO}$ and $K_{BGO}$, and the effective gain values $m_{FGO}$ and $m_{BGO}$ to estimate this possible change in the loudness compared to the default downmix case. The change is then mapped into the "Loudness compensation factor" which is applied on the output channels for producing the final "Output signals".

The following steps are applied for loudness compensation:

Receive the limited gain value $m_G$ from the SAOC-DE decoder (as defined in clause 12.8 "Modification range control for SAOC-DE" [DE]), and determine the applied FGO/BGO gains:

$$\begin{cases} m_{FGO} = m_G, \text{ and } m_{BGO} = 1 & \text{if } m_G \leq 1 \\ m_{FGO} = 1, \text{ and } m_{BGO} = m_G^{-1} & \text{if } m_G > 1 \end{cases}.$$

Obtain the meta-object loudness information $K_{FGO}$ and $K_{BGO}$.

Calculate the change in the output loudness compared to the default downmix with $$\Delta L = 10 \log_{10} \frac{m_{FGO}^2 10^{K_{FGO}/10} + m_{BGO}^2 10^{K_{BGO}/10}}{10^{K_{FGO}/10} + 10^{K_{BGO}/10}}.$$

Calculate the loudness compensation gain $g_\Delta = 10^{-0.05\Delta L}$.
Calculate the scaling factors $$g = \begin{bmatrix} g_1 \\ \vdots \\ g_N \end{bmatrix},$$

wherein $$g_i = \begin{cases} g_\Delta & \text{if channel } i \text{ belongs to } SAOC\text{-}DE \text{ output} \\ m_{BGO} g_\Delta & \text{if channel } i \text{ is a by-pass channel} \end{cases},$$

and N is the total number of output channels. In FIG. 12, the gain adjustment is divided into two steps: the gain of the possible "by-pass channels" is adjusted with $m_{BGO}$ prior to combining them with the "SAOC-DE output channels", and then a common gain $g_\Delta$ is then applied on all the combined channels. This is only a possible re-ordering of the gain adjustment operations, while g here combines both gain adjustment steps into one gain adjustment.

Apply the scaling values g on the audio channels $Y_{FULL}$ consisting of the "SAOC-DE output channels" $Y_{SAOC}$ and the possible time-aligned "by-pass channels" $Y_{BYPASS}$:
$Y_{FULL} = Y_{SAOC} \cup Y_{BYPASS}$ Applying the scaling values g on the audio channels $Y_{FULL}$ is conducted by the gain adjustment unit 1240.

$\Delta L$ as calculated above may be considered as a loudness compensation value. In general, $m_{FGO}$ indicates a rendering gain for the foreground object FGO (foreground object group), and $m_{BGO}$ indicates a rendering gain for the background object BGO (background object group).

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The inventive decomposed signal can be stored on a digital storage medium or can be transmitted on a transmission medium such as a wireless transmission medium or a wired transmission medium such as the Internet.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a non-transitory data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[BCC] C. Faller and F. Baumgarte, "Binaural Cue Coding—Part II: Schemes and applications," IEEE Trans. on Speech and Audio Proc., vol. 11, no. 6, November 2003.
[EBU] EBU Recommendation R 128 "Loudness normalization and permitted maximum level of audio signals", Geneva, 2011.
[JSC] C. Faller, "Parametric Joint-Coding of Audio Sources", 120th AES Convention, Paris, 2006.
[ISS1] M. Parvaix and L. Girin: "Informed Source Separation of underdetermined instantaneous Stereo Mixtures using Source Index Embedding", IEEE ICASSP, 2010.
[ISS2] M. Parvaix, L. Girin, J.-M. Brossier: "A watermarking-based method for informed source separation of audio signals with a single sensor", IEEE Transactions on Audio, Speech and Language Processing, 2010.
[ISS3] A. Liutkus and J. Pinel and R. Badeau and L. Girin and G. Richard: "Informed source separation through spectrogram coding and data embedding", Signal Processing Journal, 2011.
[ISS4] A. Ozerov, A. Liutkus, R. Badeau, G. Richard: "Informed source separation: source coding meets source separation", IEEE Workshop on Applications of Signal Processing to Audio and Acoustics, 2011.
[ISS5] S. Zhang and L. Girin: "An Informed Source Separation System for Speech Signals", INTERSPEECH, 2011.
[ISS6] L. Girin and J. Pinel: "Informed Audio Source Separation from Compressed Linear Stereo Mixtures", AES 42nd International Conference: Semantic Audio, 2011.
[ITU] International Telecommunication Union: "Recommendation ITU-R BS.1770-3—Algorithms to measure audio programme loudness and true-peak audio level", Geneva, 2012.
[SAOC1] J. Herre, S. Disch, J. Hilpert, O. Hellmuth: "From SAC To SAOC—Recent Developments in Parametric Coding of Spatial Audio", 22nd Regional UK AES Conference, Cambridge, UK, April 2007.
[SAOC2] J. Engdegård, B. Resch, C. Falch, O. Hellmuth, J. Hilpert, A. Hölzer, L. Terentiev, J. Breebaart, J. Koppens, E. Schuijers and W. Oomen: "Spatial Audio Object Coding (SAOC)—The Upcoming MPEG Standard on Parametric Object Based Audio Coding", 124th AES Convention, Amsterdam 2008.
[SAOC] ISO/IEC, "MPEG audio technologies—Part 2: Spatial Audio Object Coding (SAOC)," ISO/IEC JTC1/SC29/WG11 (MPEG) International Standard 23003-2.
[EP] EP 2146522 A1: S. Schreiner, W. Fiesel, M. Neusinger, O. Hellmuth, R. Sperschneider, "Apparatus and method for generating audio output signals using object based metadata", 2010.
[DE] ISO/IEC, "MPEG audio technologies—Part 2: Spatial Audio Object Coding (SAOC)—Amendment 3, Dialogue Enhancement," ISO/IEC 23003-2:2010/DAM 3, Dialogue Enhancement.
[BRE] WO 2008/035275 A2.
[SCH] EP 2 146 522 A1.
[ENG] WO 2008/046531 A1.

The invention claimed is:

1. A decoder for generating an audio output signal comprising one or more audio output channels, wherein the decoder comprises:
  a receiving interface for receiving an audio input signal comprising a plurality of audio object signals, for receiving loudness information on the audio object signals, and for receiving rendering information indicating whether one or more of the audio object signals shall be amplified or attenuated, and
  a signal processor for generating the one or more audio output channels of the audio output signal,
  wherein the signal processor is configured to determine a loudness compensation value depending on the loudness information and depending on the rendering information, and
  wherein the signal processor is configured to generate the one or more audio output channels of the audio output signal from the audio input signal depending on the rendering information and depending on the loudness compensation value.

2. A decoder according to claim 1, wherein the signal processor is configured to generate the one or more audio output channels of the audio output signal from the audio input signal depending on the rendering information and depending on the loudness compensation value, such that a loudness of the audio output signal is equal to a loudness of the audio input signal, or such that the loudness of the audio output signal is closer to the loudness of the audio input signal than a loudness of a modified audio signal that would result from modifying the audio input signal by amplifying or attenuating the audio object signals of the audio input signal according to the rendering information.

3. A decoder according to claim 2,
wherein the signal processor is configured to generate the modified audio signal by modifying the audio input signal by amplifying or attenuating the audio object signals of the audio input signal according to the rendering information, and
wherein the signal processor is configured to generate the audio output signal by applying the loudness compensation value on the modified audio signal, such that the loudness of the audio output signal is equal to the loudness of the audio input signal, or such that the loudness of the audio output signal is closer to the loudness of the audio input signal than the loudness of the modified audio signal.

4. A decoder according to claim 1,
wherein each of the audio object signals of the audio input signal is assigned to exactly one group of two or more groups, wherein each of the two or more groups comprises one or more of the audio object signals of the audio input signal,
wherein the receiving interface is configured to receive a loudness value for each group of the two or more groups as the loudness information,
wherein the signal processor is configured to determine the loudness compensation value depending on the loudness value of each of the two or more groups, and
wherein the signal processor is configured to generate the one or more audio output channels of the audio output signal from the audio input signal depending on the loudness compensation value.

5. A decoder according to claim 4, wherein at least one group of the two or more groups comprises two or more of the audio object signals.

6. A decoder according to claim 1,
wherein each of the audio object signals of the audio input signal is assigned to exactly one group of more than two groups, wherein each of the more than two groups comprises one or more of the audio object signals of the audio input signal,
wherein the receiving interface is configured to receive a loudness value for each group of the more than two groups as the loudness information,
wherein the signal processor is configured to determine the loudness compensation value depending on the loudness value of each of the more than two groups, and
wherein the signal processor is configured to generate the one or more audio output channels of the audio output signal from the audio input signal depending on the loudness compensation value.

7. A decoder according to claim 6, wherein at least one group of the more than two groups comprises two or more of the audio object signals.

8. A decoder according to claim 4,
wherein the signal processor is configured to determine the loudness compensation value according to the formula $$\Delta L = 10 \log_{10} \frac{\sum_{i=1}^{N} g_i^2 10^{(L_i-c)/10}}{\sum_{i=1}^{N} h_i^2 10^{(L_i-c)/10}}$$

or according to the formula $$\Delta L = 10 \log_{10} \frac{\sum_{i=1}^{N} g_i^2 10^{L_i/10}}{\sum_{i=1}^{N} h_i^2 10^{L_i/10}}$$

wherein $\Delta L$ is the loudness compensation value,
wherein i indicates an i-th audio object signal of the audio object signals,
wherein $L_i$ is a loudness of the i-th audio object signal,
wherein $g_i$ is a first mixing weight for the i-th audio object signal,
wherein $h_i$ is a second mixing weight for the i-th audio object signal,
wherein c is a constant value, and
wherein N is a number.

9. A decoder according to claim 4,
wherein the signal processor is configured to determine the loudness compensation value according to the formula $$\Delta L = 10 \log_{10} \frac{\sum_{i=1}^{N} g_i^2 10^{K_i/10}}{\sum_{i=1}^{N} h_i^2 10^{K_i/10}}$$

wherein $\Delta L$ is the loudness compensation value,
wherein i indicates an i-th audio object signal of the audio object signals,
wherein $g_i$ is a first mixing weight for the i-th audio object signal,
wherein $h_i$ is a second mixing weight for the i-th audio object signal,
wherein N is a number, and
wherein $K_i$ is defined according to $$K_i = L_i - L_{REF},$$

wherein $L_i$ is a loudness of the i-th audio object signal, and
wherein $L_{REF}$ is the loudness of a reference object.

10. A decoder according to claim 4,
wherein each of the audio object signals of the audio input signal is assigned to exactly one group of exactly two groups as the two or more groups,
wherein each of the audio object signals of the audio input signal is either assigned to a foreground object group of the exactly two groups or to a background object group of the exactly two groups,
wherein the receiving interface is configured to receive the loudness value of the foreground object group, wherein the receiving interface is configured to receive the loudness value of the background object group, wherein the signal processor is configured to determine the loudness compensation value depending on the loudness value of the foreground object group, and depending on the loudness value of the background object group, and wherein the signal processor is configured to generate the one or more audio output channels of the audio output signal from the audio input signal depending on the loudness compensation value.

11. A decoder according to claim 10, wherein the signal processor is configured to determine the loudness compensation value according to the formula $$\Delta L = 10\log_{10}\frac{m_{FGO}^2 10^{K_{FGO}/10} + m_{BGO}^2 10^{K_{BGO}/10}}{10^{K_{FGO}/10} + 10^{K_{BGO}/10}}$$

wherein $\Delta L$ is the loudness compensation value, wherein $K_{FGO}$ indicates the loudness value of the foreground object group, wherein $K_{BGO}$ indicates the loudness value of the background object group, wherein $m_{FGO}$ indicates a rendering gain of the foreground object group, and wherein $m_{BGO}$ indicates a rendering gain of the background object group.

12. A decoder according to claim 10, wherein the signal processor is configured to determine the loudness compensation value according to the formula $$\Delta L(A, B) = 10\log_{10}\frac{g_{FGO}^2 10^{L_{FGO}/10} + g_{BGO}^2 10^{L_{BGO}/10}}{10^{L_{FGO}/10} + 10^{L_{BGO}/10}}$$

wherein $\Delta L$ is the loudness compensation value, wherein $L_{FGO}$ indicates the loudness value of the foreground object group, wherein $L_{BGO}$ indicates the loudness value of the background object group, wherein $g_{FGO}$ indicates a rendering gain of the foreground object group, and wherein $g_{BGO}$ indicates a rendering gain of the background object group.

13. A decoder according to claim 1, wherein the receiving interface is configured to receive a downmix signal comprising one or more downmix channels as the audio input signal, wherein the one or more downmix channels comprise the audio object signals, and wherein the number of the one or more downmix channels is smaller than the number of the audio object signals, wherein the receiving interface is configured to receive downmix information indicating how the audio object signals are mixed within the one or more downmix channels, and wherein the signal processor is configured to generate the one or more audio output channels of the audio output signal from the audio input signal depending on the downmix information, depending on the rendering information and depending on the loudness compensation value.

14. A decoder according to claim 13, wherein the receiving interface is configured to receive one or more further by-pass audio object signals, wherein the one or more further by-pass audio object signals are not mixed within the downmix signal, wherein the receiving interface is configured to receive the loudness information indicating information on the loudness of the audio object signals which are mixed within the downmix signal and indicating information on the loudness of the one or more further by-pass audio object signals which are not mixed within the downmix signal, and wherein the signal processor is configured to determine the loudness compensation value depending on the information on the loudness of the audio object signals which are mixed within the downmix signal, and depending on the information on the loudness of the one or more further by-pass audio object signals which are not mixed within the downmix signal.

15. An encoder, comprising:

an object-based encoding unit for encoding a plurality of audio object signals to acquire an encoded audio signal comprising the plurality of audio object signals, and an object loudness encoding unit for encoding loudness information on the audio object signals, wherein the loudness information comprises one or more loudness values, wherein each of the one or more loudness values depends on one or more of the audio object signals, wherein each of the audio object signals of the encoded audio signal is assigned to exactly one group of two or more groups, wherein at least one of the two or more groups comprises at least two of the audio object signals of the encoded audio signal, wherein the object loudness encoding unit is configured to determine a loudness value for said at least one group.

16. A system comprising:

an encoder according to claim 15
for encoding a plurality of audio object signals to acquire an encoded audio signal comprising the plurality of audio object signals, and a decoder according to claim 1, for generating an audio output signal comprising one or more audio output channels, wherein the decoder is configured to receive the encoded audio signal as an audio input signal and to receive the loudness information wherein the decoder is configured to further receive rendering information, wherein the decoder is configured to determine a loudness compensation value depending on the loudness information and depending on the rendering information, and wherein the decoder is configured to generate the one or more audio output channels of the audio output signal from the audio input signal depending on the rendering information and depending on the loudness compensation value.

17. A method for generating an audio output signal comprising one or more audio output channels, wherein the method comprises:

receiving an audio input signal comprising a plurality of audio object signals, receiving loudness information on the audio object signals, receiving rendering information indicating whether one or more of the audio object signals shall be amplified or attenuated, determining a loudness compensation value depending on the loudness information and depending on the rendering information, and generating the one or more audio output channels of the audio output signal from the audio input signal depending on the rendering information and depending on the loudness compensation value.

18. A method for encoding, comprising:

encoding an audio input signal comprising a plurality of audio object signals, and encoding loudness information on the audio object signals, wherein the loudness information comprises one or more loudness values, wherein each of the one or more loudness values depends on one or more of the audio object signals, wherein each of the audio object signals of the encoded audio signal is assigned to exactly one group of two or more groups, wherein at least one of the two or more groups comprises at least two of the audio object signals of the encoded audio signal, wherein the method comprises determining a loudness value for said at least one group.

19. A non-transitory digital storage medium having a computer program stored thereon to perform the method for generating an audio output signal comprising one or more audio output channels, said method comprising:

receiving an audio input signal comprising a plurality of audio object signals, receiving loudness information on the audio object signals, receiving rendering information indicating whether one or more of the audio object signals shall be amplified or attenuated, determining a loudness compensation value depending on the loudness information and depending on the rendering information, and generating the one or more audio output channels of the audio output signal from the audio input signal depending on the rendering information and depending on the loudness compensation value, when said computer program is run by a computer.

20. A non-transitory digital storage medium having a computer program stored thereon to perform the method for encoding, said method comprising:

encoding an audio input signal comprising a plurality of audio object signals, and encoding loudness information on the audio object signals, wherein the loudness information comprises one or more loudness values, wherein each of the one or more loudness values depends on one or more of the audio object signals, when said computer program is run by a computer;

wherein each of the audio object signals of the encoded audio signal is assigned to exactly one group of two or more groups, wherein at least one of the two or more groups comprises at least two of the audio object signals of the encoded audio signal, wherein the method comprises determining a loudness value for said at least one group.

* * * * *